(12) United States Patent
Choi et al.

(10) Patent No.: US 12,555,894 B2
(45) Date of Patent: Feb. 17, 2026

(54) ELECTRONIC DEVICE HAVING ANTENNA

(71) Applicant: LG ELECTRONICS INC., Seoul (KR)

(72) Inventors: Woocheol Choi, Seoul (KR); Ilnam Cho, Seoul (KR); Byungwoon Jung, Seoul (KR); Kukheon Choi, Seoul (KR); Byeongyong Park, Seoul (KR); Uisheon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 124 days.

(21) Appl. No.: 18/701,089

(22) PCT Filed: Oct. 15, 2021

(86) PCT No.: PCT/KR2021/014374
§ 371 (c)(1),
(2) Date: Apr. 12, 2024

(87) PCT Pub. No.: WO2023/063455
PCT Pub. Date: Apr. 20, 2023

(65) Prior Publication Data
US 2024/0356202 A1 Oct. 24, 2024

(51) Int. Cl.
*H01Q 1/24* (2006.01)
*H01Q 1/38* (2006.01)
*H01Q 1/48* (2006.01)
*H01Q 21/00* (2006.01)
(Continued)

(52) U.S. Cl.
CPC ............ *H01Q 1/243* (2013.01); *H01Q 1/38* (2013.01); *H01Q 1/48* (2013.01); *H01Q 21/0075* (2013.01); *H05K 1/0243* (2013.01); *H05K 1/189* (2013.01); *H05K 2201/10098* (2013.01)

(58) Field of Classification Search
CPC ............ H01Q 1/243; H01Q 1/38; H01Q 1/48; H01Q 21/0075; H01Q 9/045; H01Q 21/08; H01Q 21/24; H01Q 9/0414; H05K 1/0243; H05K 1/189; H05K 2201/10098; H05K 1/147; H05K 3/363
See application file for complete search history.

(56) References Cited

U.S. PATENT DOCUMENTS 11,417,959 B2 * 8/2022 Park .................... H01Q 1/2283
2020/0266526 A1 8/2020 Choi et al.

FOREIGN PATENT DOCUMENTS

| KR | 20160080444 A * | 7/2016 | ........... H01Q 1/2291 |
|---|---|---|---|
| KR | 10-2020-0117481 A | 10/2020 | |
| KR | 10-2020-0122822 A | 10/2020 | |

(Continued)

*Primary Examiner* — Seung H Lee
(74) *Attorney, Agent, or Firm* — Birch, Stewart, Kolasch & Birch, LLP

(57) ABSTRACT

An antenna module according to one embodiment comprises: a flexible printed circuit board (FPCB) having a first ground pattern formed on both sides of a feed line, which is formed on one surface thereof, and spaced apart from the feed line; a first dielectric substrate connected to a feeding pattern in which a first metal mesh pattern operating as a radiator is formed on one surface of the FPCB; and a second dielectric substrate connected to a second ground pattern in which a second metal mesh pattern operating as a ground is formed on the other surface of the FPCB.

20 Claims, 22 Drawing Sheets

(51) Int. Cl.
*H05K 1/02* (2006.01)
*H05K 1/189* (2026.01)

(56) References Cited

FOREIGN PATENT DOCUMENTS

| KR | 10-2021-0064118 A | 6/2021 |
| WO | WO 2021/133126 A1 | 7/2021 |
| WO | WO 2021/147945 A1 | 7/2021 |

\* cited by examiner (a)

(b)

(a)

(b)

(c)

(a)

(b)

(a)

(b)

ELECTRONIC DEVICE HAVING ANTENNA

CROSS REFERENCE TO RELATED APPLICATIONS

This application is the National Phase of PCT International Application No. PCT/KR2021/014374, filed on Oct. 15, 2021, all of which is hereby expressly incorporated by reference into the present application.

TECHNICAL FIELD

The present disclosure relates to an electronic device having antennas, and more particularly, to an antenna module realized in a multi-layered circuit board and an electronic device having the same.

BACKGROUND ART

As functions of electronic devices diversify, the electronic devices can be implemented as image display devices such as multimedia players having complex functions, for example, playing music or video files, playing games, receiving broadcasts, and the like.

An image display device is a device for reproducing (playing) image contents. Image display devices receive images (videos) from various sources and reproduce the received images. Image display devices are implemented as various devices such as PCs (Personal Computers), smart phones, tablet PCs, laptop computers, TV sets, and the like. An image display device such as a smart TV may provide an application for providing web contents, such as web browsers.

The electronic device such as the image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

In this regard, an array antenna that can operate in a millimeter wave (mmWave) band may be implemented on a display of an electronic device. Meanwhile, frequency band expansion and communication module design technologies for supporting ultra-high speed and large capacity communication are rapidly evolved together with rapid development of Wi-Fi using 5G mobile communication and mmWave band. An application of such technologies to various industrial groups such as TV, robot, vehicle, terminal, etc. is taken into account. In addition, the demand for development of a thinner and lighter full-screen display to which design factors are reflected is greatly increasing.

To implement high-quality communication services, an application of a communication module that is capable of radiating radio waves in all directions in addition to a side direction of an electronic device is required. However, the design of antenna module and RF front-end using display bezels and adjacent structures has a very narrow space limitation and limits the design factors.

DISCLOSURE OF INVENTION

Technical Problem

The present disclosure is directed to solving the aforementioned problems and other drawbacks. Another aspect of the present disclosure is to provide an antenna module disposed on a display operating in a millimeter wave (mmWave) band and an electronic device including a configuration controlling the same.

Still another aspect of the present disclosure is to provide an antenna module capable of communicating with another device located in a front direction by implementing an antenna module operating in an mmWave band on a display.

Still another aspect of the present disclosure is to provide an antenna configuration capable of improving transparency of an antenna disposed in a display while improving an electrical characteristic of the antenna.

Still another aspect of the present disclosure is to provide an antenna module implementing dual polarization characteristics within a limited area.

Still another aspect of the present disclosure is to provide an antenna structure implemented in a display, capable of minimizing a signal loss characteristic in an mmWave band.

Another aspect of the present disclosure is to provide a transparent antenna having a double-layered structure that is capable of maintaining transparency as well as antenna performance.

Another aspect of the present disclosure is to suppress interference between a touch sensor/circuit and a first metal mesh pattern having an antenna pattern.

Solution to Problem

In order to achieve the above or other purposes, an antenna module according to an embodiment includes: a flexible printed circuit board (FPCB) having first ground patterns formed at both sides of a feed line formed on one surface thereof, the first ground patterns being spaced apart from the feed line; a first dielectric substrate configured such that a first metal mesh pattern is connected to the feed line formed on the one surface of the FPCB; and a second metal mesh pattern configured such that a second metal mesh pattern is connected to a second ground pattern formed on another surface of the FPCB.

In an embodiment, the first metal mesh pattern may include an antenna pattern in which metal mesh grids are interconnected in one axial direction and another axial direction. The first metal mesh pattern may include a feed pattern in which metal mesh grids are interconnected in the one axial direction. The first metal mesh pattern may include a dummy pattern in which metal mesh grids are disconnected in the one axial direction and the another axial direction.

In an embodiment, an antenna element formed by a plurality of mesh grids formed by the first metal mesh pattern may be disposed on top or bottom of a display or inside the display. The feed line formed with a predetermined width on the FPCB may be connected to the feed pattern that feeds the antenna element.

In an embodiment, the feed line may include a transition region implemented as a CPW transmission line with the first ground patterns disposed at the both sides of the feed line and configured to perform impedance matching between the antenna element and the feed line. The feed line may include a signal line region in which the feed line is disposed by a predetermined length in a first axial direction. The feed line disposed in the signal line region may be formed as a microstrip line on the FPCB.

In an embodiment, the dummy pattern may include a first dummy pattern disposed in a dielectric region and having metal mesh grids disposed to be disconnected from one another in the one axial direction and the another axial direction. The ground pattern may include a second dummy pattern disposed between the antenna pattern and the feed pattern, and having metal mesh grids disposed in the another axial direction to be disconnected from the antenna pattern and the feed pattern.

In an embodiment, the antenna pattern may operate as a dual polarization antenna with polarization in the one axial direction and polarization in the another axial direction by the feed pattern and the second feed pattern. The second feed pattern may be configured such that metal mesh grids are interconnected in the another axial direction.

In an embodiment, the second metal mesh pattern may be configured such that metal mesh grids are interconnected in the one axial direction and the another axial direction. form a ground pattern. The antenna pattern of the first metal mesh pattern and the ground pattern corresponding to the second metal mesh pattern may configure a patch antenna that radiates a wireless signal toward top of the first dielectric substrate.

In an embodiment, shape, thickness in a height direction, and line width of the first metal mesh pattern may correspond to shape, thickness in a height direction, and line width of the second metal mesh pattern.

In an embodiment, a first point where grids of the first metal mesh pattern intersect in the one axial direction and the another axial direction may correspond to a second point where grids of the second metal mesh pattern intersect in the one axial direction and the another axial direction.

In an embodiment, the antenna module may further include an OCA layer disposed on the same layer as the FPCB and may be configured to bond the first dielectric substrate and the second dielectric substrate.

In an embodiment, the second dielectric substrate may be disposed in an upper region of a display, and the antenna pattern may radiate a wireless signal toward a top of the first dielectric substrate.

In an embodiment, the first dielectric substrate may be attached to a lower region of a display, and the second dielectric substrate may be attached to an upper region of a lower structure. The antenna pattern may radiate a wireless signal through the display on a top of the first dielectric substrate.

In an embodiment, the antenna module may be disposed between a first display and a second display. The first dielectric substrate may be attached to a lower region of the first display, and the second dielectric substrate may be attached to an upper region of the second display. The antenna pattern may radiate a wireless signal through the first display on a top of the first dielectric substrate.

In an embodiment, the FPCB may be pre-bonded to an ACF layer by a heat-based pressing operation. The FPCB may be bonded to the second dielectric substrate in a state where the second metal mesh pattern formed on the second dielectric substrate is aligned with the ground pattern on another surface of the FPCB. An OCA layer may be formed in a region adjacent to the FPCB on the same layer as the FPCB to correspond to an upper end of the FPCB.

In an embodiment, a second ACF layer may be attached to a top of the feed line formed on one surface of the FPCB. The FPCB may be pre-bonded to the second ACF layer by a heat-based pressing operation. The FPCB may be bonded to the first dielectric substrate in a state where the first metal mesh pattern formed on the first dielectric substrate is aligned with the feed line on the one surface of the FPCB.

According to another aspect of the present disclosure, there is provided an electronic device having an antenna module. The electronic device may include: a display configured to output information to a screen and having a metal mesh pattern to radiate wireless signals to adjacent electronic devices; and an antenna module disposed on a lower region of the electronic device. The antenna module may include: a flexible printed circuit board (FPCB) with a feed line and a ground pattern formed on one surface and another surface thereof; a first dielectric substrate configured such that a first metal mesh pattern is connected to the feed line formed on the FPCB; and a second dielectric substrate configured such that a second metal mesh pattern is connected to the ground pattern formed on the FPCB.

In an embodiment, the first metal mesh pattern may include: an antenna pattern configured such that metal mesh grids are interconnected in one axial direction; and a feed pattern configured such that metal mesh grids are interconnected in the one axial direction. The first metal mesh pattern may further include a dummy pattern configured such that metal mesh grids are disconnected in the one axial direction and the another axial direction.

In an embodiment, wherein the dummy pattern may include: a first dummy pattern disposed in a dielectric region and having metal mesh grids disposed to be disconnected from one another in the one axial direction and the another axial direction; and a second dummy pattern disposed between the antenna pattern and the feed pattern, and having metal mesh grids disposed in the another axial direction to be disconnected from the antenna pattern and the feed pattern.

In an embodiment, the antenna pattern may operate as a dual polarization antenna with polarization in the one axial direction and polarization in the another axial direction by the feed pattern and the second feed pattern. The second feed pattern may be configured such that metal mesh grids are interconnected in the another axial direction.

In an embodiment, the second metal mesh pattern may be configured such that metal mesh grids are interconnected in the one axial direction and the another axial direction, to form a ground pattern. A wireless signal may be radiated toward the front of the electronic device by the antenna pattern of the first metal mesh pattern and the ground pattern corresponding to the second metal mesh pattern.

In an embodiment, the electronic device may further include a transceiver circuit electrically connected to the antenna module and configured to apply a first signal and a second signal to the antenna pattern through the feed pattern and the second feed pattern. The electronic device may further include a processor operably coupled to the transceiver circuit to control the transceiver circuit.

In an embodiment, the processor may control the transceiver circuit to perform first beamforming by a first signal and second beamforming by a second signal while performing multiple input/multiple output (MIMO), in response to the first signal and the second signal being applied to array antennas disposed in a plurality of antenna elements.

Advantageous Effects of Invention

Hereinafter, technical effects of the antenna module disposed in the display operating in the millimeter wave (mmwave) band and the electronic device including the configuration for controlling the same will be described.

According to an embodiment, an antenna element operating in an mmWave band can be implemented in a metal mesh structure within a display, to communicate with another device in a front direction.

According to an embodiment, an antenna configuration capable of improving transparency of an antenna disposed in a display by using a dummy pattern while improving an electrical characteristic of the antenna can be provided.

According to an embodiment, an antenna module implementing dual polarization characteristics can be provided in a double-layered patch antenna.

According to an embodiment, an antenna module implemented in a display, which is capable of minimizing a spacing between antennas and minimizing a signal loss characteristic in an mmWave band through impedance matching in a transition region between a transparent antenna and a feed line, can be provided.

According to an embodiment, transparency can be maintained while maintaining antenna performance through alignment between metal mesh grids of a radiator and metal mesh grids of a ground pattern.

According to an embodiment, a second metal mesh pattern for a double-layered antenna structure can operate as a ground pattern, thereby suppressing interference between a touch sensor/circuit and a first metal mesh pattern on which an antenna pattern is formed.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

MODE FOR THE INVENTION

Figure 1:
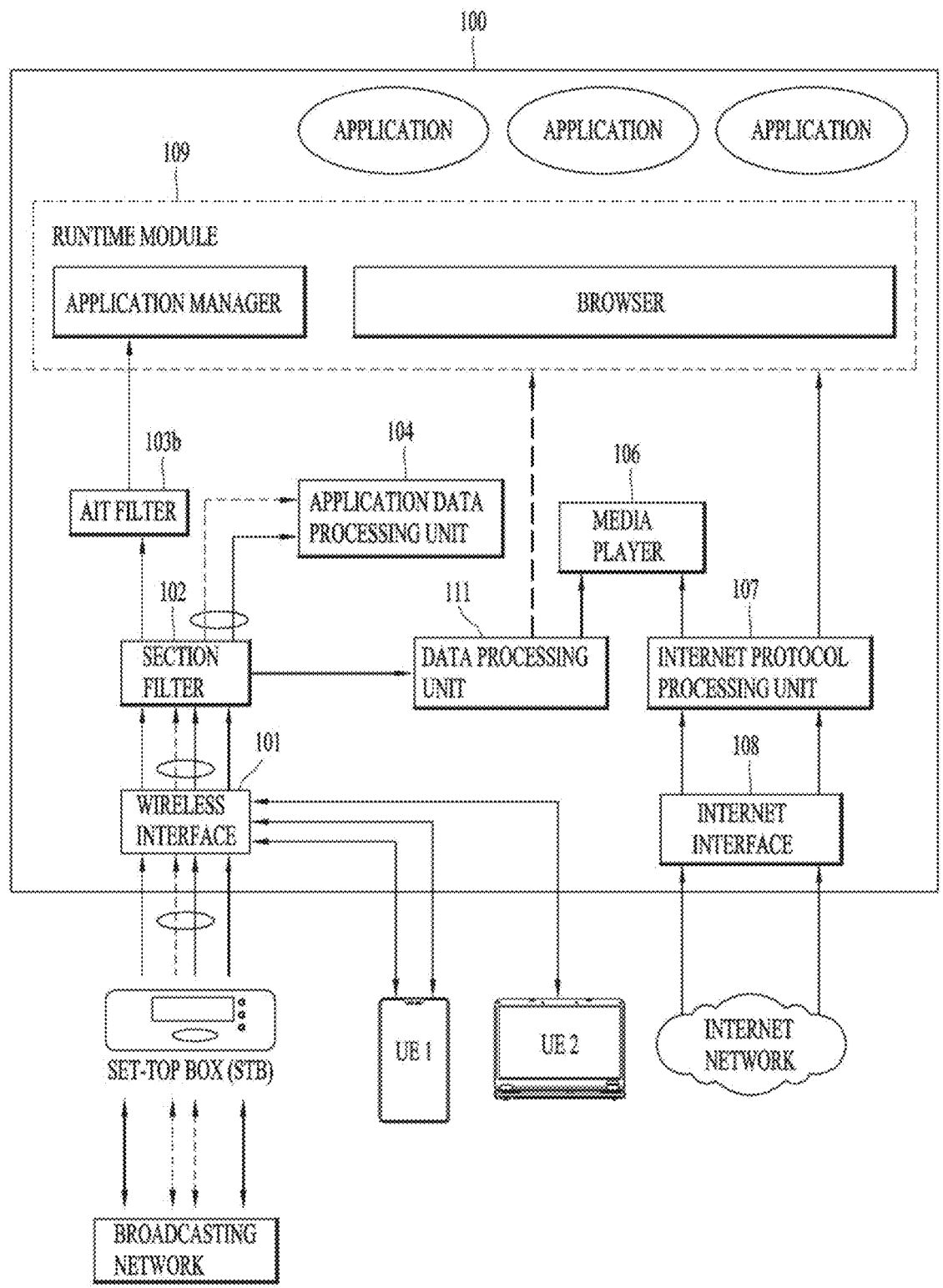
FIG. 1 is a diagram schematically illustrating an example of an entire wireless AV system including an image display device according to one embodiment of the present disclosure.

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. A suffix "module" or "unit" used for elements disclosed in the following description is merely intended for easy description of the specification, and the suffix itself is not intended to give any special meaning or function. In describing the embodiments disclosed herein, moreover, the detailed description will be omitted when specific description for publicly known technologies to which the invention pertains is judged to obscure the gist of the present disclosure. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Electronic devices presented herein may be implemented using a variety of different types of terminals. Examples of such devices include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signages, and the like.

FIG. 1 is a diagram schematically illustrating an example of an entire wireless AV system including an image display device according to one embodiment of the present disclosure.

As illustrated in FIG. 1, an image display device 100 according to one embodiment of the present disclosure is connected to the wireless AV system (or a broadcasting network) and an Internet network. The image display device 100 may be, for example, a network TV, a smart TV, a hybrid broadcast broadband TV (HBBTV), or the like.

The image display device 100 may be wirelessly connected to the wireless AV system (or the broadcasting network) via a wireless interface or wirelessly or wiredly connected to the Internet network via an Internet interface. In relation to this, the image display device 100 may be configured to be connected to a server or another electronic device via a wireless communication system. As an example, the image display device 100 needs to provide an 802.11ay communication service operating in a millimeter wave (mmWave) band to transmit or receive large-capacity data at a high speed.

The mmWave band may be any frequency band in a range of 10 GHz to 300 GHz. In this disclosure, the mmWave band may include an 802.11ay band of a 60 GHz band. In addition, the mmWave band may include a 5G frequency band of a 28 GHz band or the 802.11ay band of the 60 GHz band. The 5G frequency band may be set to about 24 to 43 GHz band and the 802.11ay band may be set to 57 to 70 GHz or 57 to 63 GHz band, but are not limited thereto.

The image display device 100 may wirelessly transmit or receive data to/from an electronic device in a periphery of the image display device 100, e.g., a set-top box or another electronic device via the wireless interface. As an example, the image display device 100 may transmit or receive wireless AV data to/from a set-top box or another electronic device, e.g., a mobile terminal arranged in front of or below the image display device 100.

The image display device 100 includes, for example, a wireless interface 101b, a section filter 102b, an application information table (AIT) filter 103b, an application data processing unit 104b, a data processing unit 111b, a media player 106b, an Internet protocol processing unit 107b, an Internet interface 108b, and a runtime module 109b.

Through a broadcast interface that is the wireless interface 101b, AIT data, real-time broadcast content, application data, and a stream event are received. The real-time broadcast content may be referred to as linear audio/video (A/V) content.

The section filter 102b performs section filtering on four types of data received through the wireless interface 101b to transmit the AIT data to the AIT filter 103b, the linear A/V content to the data processing unit 111b, and the stream events and the application data to the application data processing unit 104b.

Non-linear A/V content and the application data are received through the Internet interface 108b. The non-linear AN content may be, for example, a content on demand (COD) application. The non-linear A/V content is transmitted to the media player 106b, and the application data is transmitted to the runtime module 109b.

Further, the runtime module 109b includes, for example, an application manager and a browser as illustrated in FIG. 1. The application manager controls a life cycle of an interactive application using, for example, the AIT data. In addition, the browser performs, for example, a function of displaying and processing the interactive application.

Hereinafter, a communication module having an antenna for providing a wireless interface in an electronic device such as the above-described image display device will be described in detail. In relation to this, the wireless interface for communication between electronic devices may be a WiFi wireless interface, but is not limited thereto. As an example, a wireless interface supporting the 802.11ay standard may be provided for high-speed data transmission between electronic devices.

The 802.11ay standard is a successor standard for raising a throughput for the 802.11ad standard to 20 Gbps or greater. An electronic device supporting an 802.11ay wireless interface may be configured to use a frequency band of about 57 to 64 GHz. The 802.11ay wireless interface may be configured to provide backward compatibility for an 802.11ad wireless interface. The electronic device providing the 802.11ay wireless interface may be configured to provide coexistence with a legacy device using the same band.

In relation to a wireless environment for the 802.11ay standard, it may be configured to provide a coverage of 10 meters or longer in an indoor environment, and 100 meters or longer in an outdoor environment with a line of sight (LOS) channel condition.

The electronic device supporting the 802.11ay wireless interface may be configured to provide visual reality (VR) headset connectivity, support server backups, and support cloud applications that require low latency.

An ultra-short range (USR) communication scenario, i.e., a near field communication scenario which is a use case of the 802.11ay wireless interface, is a model for fast large-capacity data exchange between two terminals. The USR communication scenario may be configured to require low power consumption of less than 400 mW, while providing a fast link setup within 100 msec, transaction time within 1 second, and a 10 Gbps data rate at a very close distance of less than 10 cm.

As the use case of the 802.11ay wireless interface, the 8K UHD Wireless Transfer at Smart Home Usage Model may be taken into account. In the Smart Home Usage Model, a wireless interface between a source device and a sync device may be taken into consideration to stream 8K UHD content at home. In relation to this, the source device may be one of a set-top box, a Blue-ray player, a tablet PC, and a smart phone and the sink device may be one of a smart TV and a display device, but are not limited thereto. In relation to this, the wireless interface may be configured to transmit uncompressed 8K UHD streaming data (60 fps, 24 bits per pixel, at least 4:2:2) with a coverage of less than 5 m between the source device and the sink device. To do so, the wireless interface may be configured such that data is transmitted between electronic devices at a speed of at least 28 Gbps.

In order to provide such a wireless interface, embodiments related to an array antenna operating in an mmWave band and an electronic device including the array antenna will be described with reference to the accompanying drawings. It will be apparent to those skilled in the art that the present disclosure may be embodied in other specific forms without departing from the spirit or essential characteristics thereof.

Figure 2:
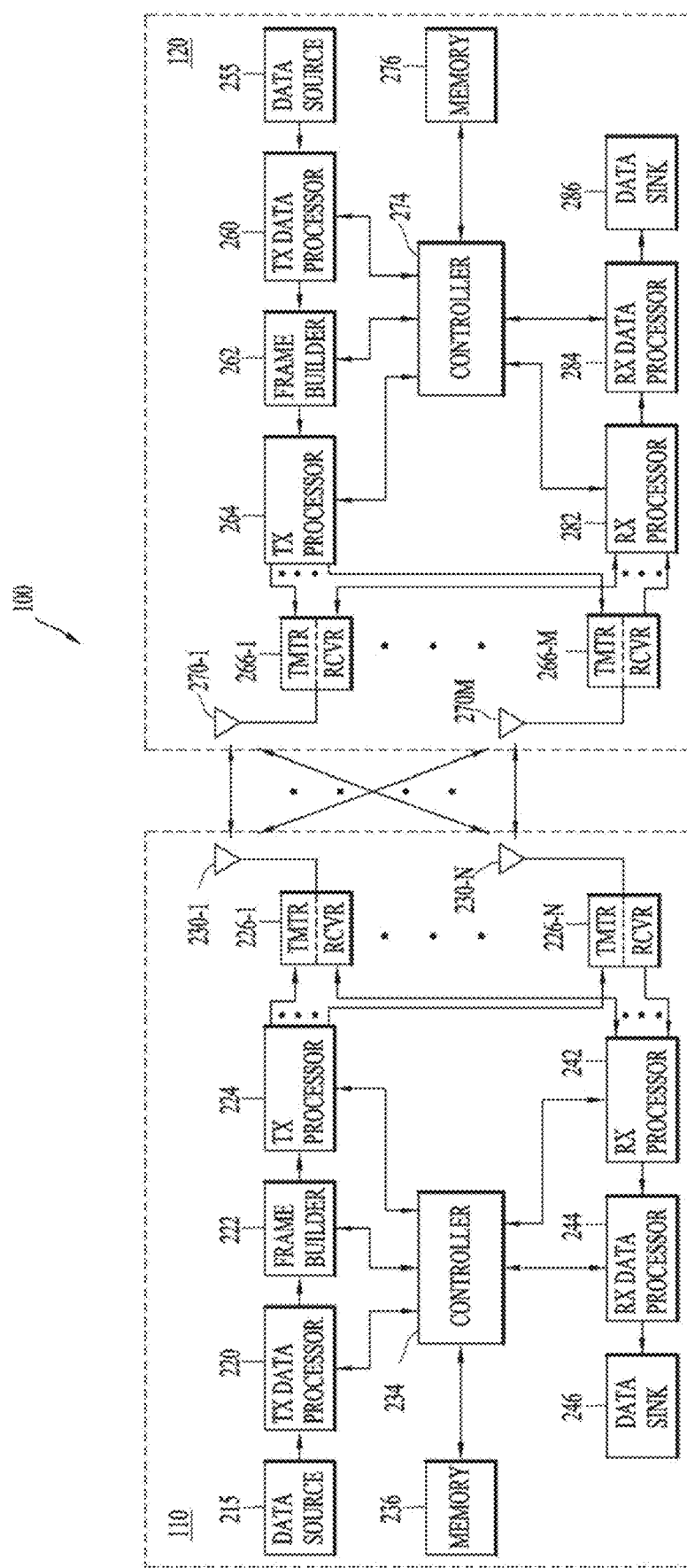
FIG. 2 illustrates a detailed configuration of electronic devices configured to support wireless interfaces according to the present disclosure.

FIG. 2 illustrates a detailed configuration of electronic devices configured to support wireless interfaces according to the present disclosure. FIG. 2 illustrates a block diagram of an access point 110 (generally, a first wireless node) and an access terminal 120 (generally, a second wireless node) in a wireless communication system. The access point 110 is a transmitting entity for downlink transmission and a receiving entity for uplink transmission. The access terminal 120 is a transmitting entity for uplink transmission and a receiving entity for downlink transmission. As used herein, the "transmitting entity" is an independently operating apparatus or device capable of transmitting data through a wireless channel, and the "receiving entity" is an independently operating apparatus or device capable of receiving data through a wireless channel.

Referring to FIGS. 1 and 2, the set-top box (STB) of FIG. 1 may be the access point 110, and an electronic device, that is, the image display device 100 of FIG. 1 may be the access terminal 120, but are not limited thereto. Accordingly, it should be understood that the access point 110 may alternatively be an access terminal, and the access terminal 120 may alternatively be an access point.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

To transmit data, the access point 110 includes a transmission (TX) data processor 220, a frame builder 222, a TX processor 224, a plurality of transceivers 226-1 to 226-N, and a plurality of antennas 230-1 to 230-N. The access point 110 also includes a controller 234 configured to control operations of the access point 110.

During operation, the TX data processor 220 receives data (e.g., data bits) from a data source 215, and processes the data for transmission. For example, the TX data processor 220 may encode data (e.g., data bits) into encoded data, and modulate the encoded data into data symbols. The TX data processor 220 may support different modulation and coding schemes (MCSs). For example, the TX data processor 220 may encode data at any one of a plurality of different coding rates (e.g., using low-density parity check (LDPC) encoding). In addition, the TX data processor 220 may modulate the encoded data using any one of a plurality of different modulation schemes including, but not limited to, BPSK, QPSK, 16QAM, 64QAM, 64APSK, 128APSK, 256QAM, and 256APSK.

The controller 234 may transmit, to the TX data processor 220, a command for specifying an MCS to be used (e.g., based on channel conditions for downlink transmission). The TX data processor 220 may encode and modulate the data received from the data source 215 according to the specified MCS. It needs to be recognized that the TX data processor 220 may perform additional processing on the data, such as data scrambling and/or other processing. The TX data processor 220 outputs the data symbols to the frame builder 222.

The frame builder 222 constructs a frame (also referred to as a packet) and inserts the data symbols into a data payload of the frame. The frame may include a preamble, a header, and a data payload. The preamble may include a short training field (STF) sequence and a channel estimation (CE) sequence to assist the access terminal 120 in receiving the frame. The header may include information regarding data in a payload, such as a length of the data and an MCS used to encode and modulate the data. Based on this information, the access terminal 120 may demodulate and decode the data. The data in the payload may be partitioned among a plurality of blocks, and each block may contain a part of the data and a guard interval (GI) to assist the receiver in phase tracking. The frame builder 222 outputs the frame to the TX processor 224.

The TX processor 224 processes the frame for transmission on downlink. For example, the TX processor 224 may support different transmission modes, e.g., an orthogonal frequency-division multiplexing (OFDM) transmission mode and a single-carrier (SC) transmission mode. In this example, the controller 234 may transmit, to the TX processor 224, a command for specifying a transmission mode to be used, and the TX processor 224 may process the frame for transmission according to the specified transmission mode. The TX processor 224 may apply a spectrum mask to the frame so that a frequency configuration of a downlink signal complies with particular spectrum requirements.

The TX processor 224 may support multiple-input-multiple-output (MIMO) transmission. In these aspects, the access point 110 may include a plurality of antennas 230-1 to 230-N and a plurality of transceivers 226-1 to 226-N (e.g., one for each antenna). The TX processor 224 may perform spatial processing on incoming frames and provide a plurality of transmission frame streams to a plurality of antennas. The transceivers 226-1 to 226-N receive and process (e.g., convert to analog, amplify, filter, and frequency up-convert) each of the transmission frame streams to generate transmission signals for transmission through the antennas 230-1 to 230-N.

To transmit data, the access terminal 120 includes a TX data processor 260, a frame builder 262, a TX processor 264, a plurality of transceivers 266-1 to 266-M, and a plurality of antennas 270-1 to 270-M (e.g., one antenna per transceiver). The access terminal 120 may transmit data to the access point 110 on uplink and/or transmit the data to another access terminal (e.g., for peer-to-peer communication). The access terminal 120 also includes a controller 274 configured to control operations of the access terminal 120.

The transceivers 266-1 to 266-M receive and process (e.g., convert to analog, amplify, filter, and frequency up-convert) an output from the TX processor 264 for transmission via one or more of the antennas 270-1 to 270-M. For example, the transceiver 266-1 may up-convert the output from the TX processor 264 into a transmission signal having a frequency in a 60 GHz band. Accordingly, the antenna module described herein may be configured to perform a beamforming operation in the 60 GHz band, for example, in a band of about 57 to 63 GHZ. In addition, the antenna module may be configured to support MIMO transmission while performing beamforming in the 60 GHz band.

In relation to this, the antennas 270-1 to 270-M and the transceivers 266-1 to 266-M may be implemented in an integrated form on a multi-layer circuit substrate. To do so, among the antennas 270-1 to 270-M, an antenna configured to operate with vertical polarization may be vertically arranged inside the multi-layer circuit substrate.

To receive data, the access point 110 includes a reception (RX) processor 242 and an RX data processor 244. During operation, the transceivers 226-1 to 226-N receive a signal (e.g., from the access terminal 120) and spatially process (e.g., frequency down-convert, amplify, filter, and digitally convert) the received signal.

The RX processor 242 receives outputs from the transceivers 226-1 through 226-N and processes the outputs to recover data symbols. For example, the access point 110 may receive data from a frame (e.g., from the access terminal 120). In this example, the RX processor 242 may detect a start of the frame using a short training field (STF) sequence in a preamble of the frame. The RX processor 242 may also use the STF for automatic gain control (AGC) adjustment. The RX processor 242 may also perform channel estimation (e.g., using a channel estimation (CE) sequence in the preamble of the frame), and perform channel equalization on the received signal based on the channel estimation.

The RX data processor 244 receives data symbols from the RX processor 242 and an indication of a corresponding MSC scheme from the controller 234. The RX data processor 244 demodulates and decodes the data symbols, recovers the data according to the indicated MSC scheme, and stores and/or outputs the recovered data (e.g., data bits) to a data sink 246 for additional processing.

The access terminal 120 may transmit the data using an orthogonal frequency-division multiplexing (OFDM) transmission mode or a single-carrier (SC) transmission mode. In this case, the RX processor 242 may process the received signal according to a selected transmission mode. In addition, as described above, the TX processor 264 may support MIMO transmission. In this case, the access point 110 includes the antennas 230-1 to 230-N and the transceivers 226-1 to 226-N (e.g., one for each antenna). Accordingly, the antenna module described herein may be configured to perform a beamforming operation in the 60 GHz band, for example, in a band of about 57 to 63 GHZ. In addition, the antenna module may be configured to support MIMO transmission while performing beamforming in the 60 GHz band.

In relation to this, the antennas 230-1 to 230-M and the transceivers 226-1 to 226-M may be implemented in an integrated form on a multi-layer circuit substrate. To do so, among the antennas 230-1 to 230-M, an antenna configured to operate with vertical polarization may be vertically arranged inside the multi-layer circuit substrate.

Meanwhile, each transceiver receives and processes (e.g., frequency down-converts, amplifies, filters, and digitally converts) a signal from each antenna. The RX processor 242 may perform spatial processing on the outputs from the transceivers 226-1 to 226-N to recover the data symbols.

The access point 110 also includes a memory 236 coupled to the controller 234. The memory 236 may store commands that, when executed by the controller 234, cause the controller 234 to perform one or more of the operations described herein. Similarly, the access terminal 120 also includes a memory 276 coupled to the controller 274. The memory 276 may store commands that, when executed by the controller 274, cause the controller 274 to perform one or more of the operations described herein.

Figure 3A:
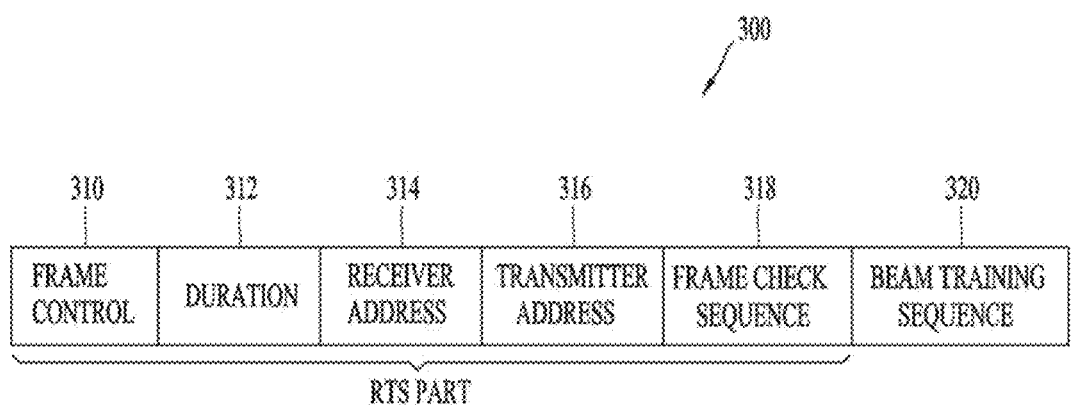
FIG. 3A illustrates a request to send (RTS) and a clear to send (CTS) according to the present disclosure.

Meanwhile, an electronic device supporting 802.11ay wireless interface according to the present disclosure determines whether or not a communication medium is available to communicate with other electronic devices. To this end, the electronic device transmits a Request to Send (RTS)-TRN frame including an RTS part and a first beam training sequence. In this regard, FIG. 3A illustrates a Request to Send (RTS) and a Clear to Send (CTS) according to the present disclosure. A transmitting device may use an RTS frame to determine whether a communication medium is available to transmit one or more data frames to a destination device. In response to the reception of the RTS frame, the destination device transmits a CTS frame to the transmitting device when the communication medium is available. In response to the reception of the CTS frame, the transmitting device transmits the one or more data frames to the destination device. In response to the successful reception of the one or more data frames, the destination device transmits one or more acknowledgment ("ACK") frames to the transmitting device.

Referring to (a) of FIG. 3A, a frame 300 includes an RTS part including a frame control field 310, a duration field 312, a receiver address field 314, a transmitter address field 316, and a frame check sequence field 318. For the purpose of improved communication and interference reduction, the frame 300 further includes a beam training sequence field 320 to configure antennas of a destination device and one or more neighboring devices, respectively.

Referring to (b) of FIG. 3A, a CTS frame 350 includes a CTS part including a frame control field 360, a duration field 362, a receiver address field 314, and a frame check sequence field 366. For the purpose of improved communication and interference reduction, the frame 350 further includes a beam training sequence field 368 to configure antennas of a transmitting device and one or more neighboring devices, respectively.

The beam training sequence fields 320 and 368 may comply with the training (TRN) sequence in accordance with IEEE 802.11ad or 802.11ay. The transmitting device may use the beam training sequence field 368 to configure its antenna for directional transmission to the destination device. On the other hand, the transmitting devices may use the beam training sequence field to configure their own antennas to reduce transmission interference at the destination device. In this case, the transmitting devices may use the beam training sequence field to configure their own antennas to generate antenna radiation patterns with nulls aimed at the destination device.

Therefore, electronic devices supporting 802.11 ay wireless interface may form initial beams to have a low interference level therebetween using beamforming patterns determined according to the beam training sequence. In this regard, FIG. 3B is a block diagram illustrating a communication system 400 according to an example of the present disclosure. As illustrated in FIG. 3B, first and second devices 410 and 420 may improve communication performance by matching directions of main beams. On the other hand, the first and second devices 410 and 420 may form signal-null having weak signal intensity in a specific direction, in order to reduce interference with a third device 430.

In relation to the formation of the main beam and the signal-null, a plurality of electronic devices according to the present disclosure may perform beamforming through array antennas. Referring to FIG. 3B, some of the plurality of electronic devices may alternatively be configured to perform communication with an array antenna of another electronic device through a single antenna. In this regard, when performing communication through the single antenna, a beam pattern is formed as an omnidirectional pattern.

Referring to FIG. 3B, the first to third devices 410 to 430 perform beamforming but a fourth device 440 does not perform beamforming, but the present disclosure is not limited thereto. Therefore, it may alternatively be configured such that three of the first to fourth devices 410 to 440 perform beamforming and the other may not perform beamforming.

As another example, it may be configured such that any one of the first to fourth devices 410 to 440 performs beamforming and the remaining three devices do not perform beamforming. As still another example, it may be configured such that two of the first to fourth devices 410 to 440 perform beamforming and the remaining two devices do not perform beamforming. As still another example, all the first to fourth devices 410 to 440 may be configured to perform beamforming.

Referring to FIGS. 3A and 3B, the first device 410 determines that it is an intended receiving device of the CTS-TRN frame 350 on the basis of an address displayed on the receiver address field 364 of the CTS-TRN frame 350. In response to the determination as the intended receiving device of the CTS-TRN frame 350, the first device 410 may use the beam training sequence of the beam training sequence field 368 of the received CTS-TRN 350 to configure its own antenna for a directional transmission substantially and selectively aimed at the second device 420. That is, the antenna of the first device 410 is configured to generate a primary lobe (e.g., highest gain lobe) substantially aimed at the second device 420, and an antenna radiation pattern with non-primary lobes aimed at other directions.

The second device 420 already knows the direction toward the first device 410 based on the beam training sequence of the beam training sequence field 320 of the previously-received RTS-TRN frame 300. Therefore, the second device 420 may configure its own antenna for a directional reception (e.g., primary antenna radiation lobe) selectively aimed at the first device 410. Therefore, while the antenna of the first device 410 is configured for the directional transmission toward the second device 420 and the antenna of the second device 420 is configured for the directional reception from the first device 410, the first device 410 transmits one or more data frames to the second device 420. Accordingly, the first and second devices 410 and 420 perform directional transmission/reception (DIR-TX/RX) of the one or more data frames through the primary lobe (main beam).

On the other hand, the first and second devices 410 and 420 may partially modify the beam pattern of the third device 430 to reduce interference with the third device 430 due to an antenna radiation pattern with the non-primary lobes.

In this regard, the third device 430 determines that it is not an intended receiving device of the CTS-TRN frame 350 on the basis of an address indicated in the receiver address field 364 of the CTS-TRN frame 350. In response to the determination that it is not the intended receiving device of the CTS-TRN frame 350, the third device 430 uses the beam training sequence of the beam training sequence field 368 of the received CTS-TRN 350 and the sequence of the beam training sequence field 320 of the previously-received RTS-TRN frame 300, in order to configure its antenna to generate antenna radiation patterns each with nulls substantially aimed at the second device 420 and the first device 410. The nulls may be based on estimated arrival angles of the previously-received TRS-TRN frame 300 and CTS-TRN frame 350. In general, the third device 430 generates antenna radiation patterns with desired signal power, refusals, or gains aimed at the first device 410 and the second device 420 such that estimated interferences at the devices 410 and 420 are equal to or lower than a defined threshold value (e.g., to achieve a desired bit error rate (BER), signal-to-noise ratio (SNR), signal-to-interference ratio (SINR), and/or other one or more communication attributes).

The third device 430 may configure its antenna transmission radiation pattern by estimating antenna gains in directions toward the first and second devices 410 and 420, estimating antenna mutuality differences (e.g., transmitting antenna gain-receiving antenna gain) between the third device 430 and the first and second devices 410 and 420, and calculating those values over one or more sectors for determining corresponding estimated interferences at the first and second devices 410 and 420.

The third device 430 transmits the RTS-TRN frame 300 intended for the fourth device 440, which the fourth device 440 receives. The third device 430 maintains an antenna configuration with nulls aimed at the first and second devices 410 and 420 as long as the first device 410 and the second device 420 are communicating based on durations displayed on the duration fields 312 and 362 of the RTS-TRN frame 300 and the CTS-TRN frame 350, respectively. As the antenna of the third device 430 is configured to produce the nulls aimed at the first device 410 and the second device 420, the transmission of the RTS-TRN frame 300 by the third device 430 may produce reduced interferences at the first device 410 and the second device 420.

Therefore, electronic devices supporting the 802.11ay wireless interface disclosed herein can form a signal-null to a specific direction for interference reduction while matching a main beam direction therebetween using array antennas. To this end, the plurality of electronic devices may form an initial beam direction through a beam training sequence, and change the beam direction through the periodically updated beam training sequence.

As aforementioned, the beam directions should be matched between the electronic devices for high-speed data communication between the electronic devices. Also, the loss of wireless signals transmitted to an antenna element should be minimized for the high-speed data communication. To this end, the array antenna should be disposed inside a multi-layered substrate on which an RFIC is disposed. Also, the array antenna is necessarily disposed adjacent to a side area inside the multi-layered substrate for radiation efficiency.

In addition, the beam training sequence should be updated to adapt to the change of a wireless environment. To update the beam training sequence, the RFIC should periodically transmit and receive signals to and from a processor such as a modem. Therefore, control signal transmission and reception between the RFIC and the modem should also be carried out within fast time to minimize an update delay time. To this end, a physical length of a connection path between the RFIC and the modem should be reduced. To this end, the modem may be disposed on the multi-layered substrate on which the array antenna and the RFIC are disposed. Or, in the structure that the array antenna and the RFIC are disposed on the multi-layered substrate and the modem is disposed on a main substrate, the connection length between the RFIC and the modem may be minimized. A detailed structure thereof will be described later with reference to FIG. 5C.

Figure 4:
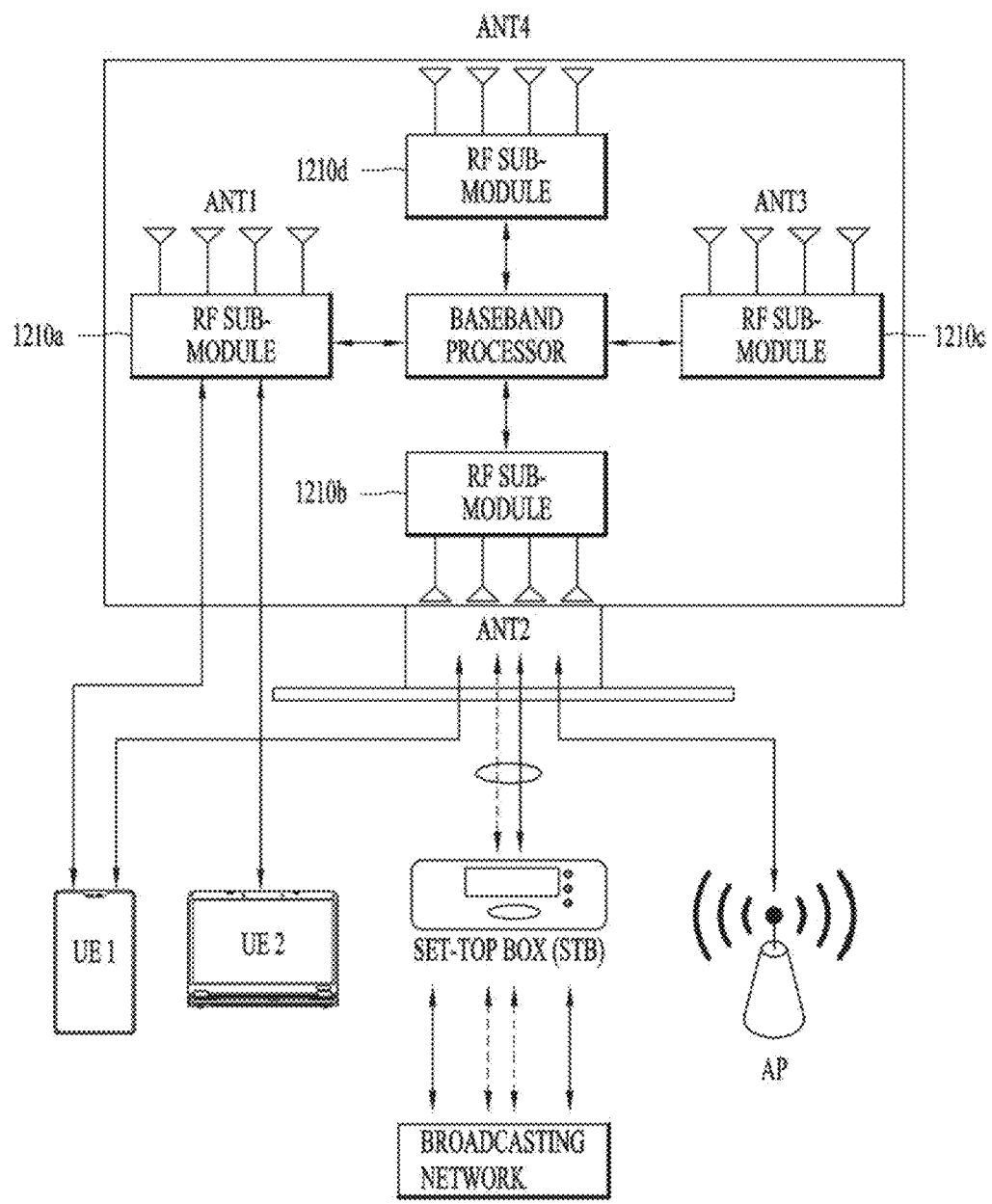
FIG. 4 is a diagram illustrating an electronic device including a plurality of antenna modules and a plurality of transceiver circuit modules in accordance with one embodiment.

Hereinafter, an electronic device having an array antenna that can operate in an mmWave band will be described. In this regard, FIG. 4 is a diagram illustrating an electronic device including a plurality of antenna modules and a plurality of transceiver circuit modules in accordance with one embodiment. Referring to FIG. 4, a home appliance in which a plurality of antenna modules and a plurality of transceiver circuit modules are disposed may be a television, but is not limited thereto. Therefore, the home appliance having the plurality of antenna modules and the plurality of transceiver circuit modules disclosed herein may include an arbitrary home appliance or display device that supports a communication service in a millimeter wave band.

Referring to FIG. 4, the electronic device 1000 includes a plurality of antenna modules ANT1 to ANT4 and a plurality of transceiver circuit modules 1210a to 1210d. In this regard, the plurality of transceiver circuit modules 1210a to 1210d may correspond to the aforementioned transceiver circuit 1250. Or, the plurality of transceiver circuit modules 1210a to 1210d may be a partial configuration of the transceiver circuit 1250 or a partial configuration of a front end module disposed between the antenna module and the transceiver circuit 1250.

The plurality of antenna modules ANT1 to ANT4 may be configured as array antennas with a plurality of antenna elements. The number of elements of each antenna module ANT1 to ANT4 may be two, three, four, and the like as aforementioned, but it not limited thereto. For example, the number of antenna modules ANT1 to ANT4 may be expanded to two, four, eight, sixteen, and the like. Also, the elements of the antenna modules ANT1 to ANT4 may be selected by the same number or different numbers. The plurality of antenna modules ANT1 to ANT4 may be disposed on different areas of the display or on a bottom or side surface of the electronic device. The plurality of antenna modules ANT1 to ANT4 may be disposed on top, left, bottom, and right sides of the display, but the present disclosure is not limited thereto. As another example, the plurality of antenna modules ANT1 to ANT4 may alternatively be disposed on a left top portion, a right top portion, a left bottom portion, and a right bottom portion of the display.

The antenna modules ANT1 to ANT4 may be configured to transmit and receive signals at an arbitrary frequency band in a specific direction. For example, the antenna modules ANT1 to ANT4 may operate at one of 20 GHz band, 39 GHz band, and 64 GHz band.

The electronic device may maintain a connection state with different entities through two or more of the antenna modules ANT1 to ANT4 or perform data transmission or reception therefor. In this regard, the electronic device corresponding to the display device may transmit or receive data to or from a first entity through the first antenna module ANT1. The electronic device may transmit or receive data to or from a second entity through the second antenna module ANT2. As one example, the electronic device may transmit or receive data to or from a mobile terminal (User Equipment (UE)) through the first antenna module ANT1. The electronic device may transmit or receive data to or from a control device such as a set-top box or access point (AP) through the second antenna module ANT2.

The electronic device may transmit or receive data to or from other entities through the other antenna modules, for example, the third antenna module ANT3 and the fourth antenna module ANT4. As another example, the electronic device may perform dual connectivity or MIMO with at least one of previously-connected first and second entities through the third antenna module ANT3 and the fourth antenna module ANT4.

The mobile terminals UE1 and UE2 may be disposed on a front area of the electronic device to communicate with the first antenna module ANT1. On the other hand, the set-top box STB or the AP may be disposed on a bottom area of the electronic device to communicate with the second antenna module ANT2 but is not limited thereto. As another example, the second antenna module ANT2 may include a first antenna radiating a signal to the bottom area, and a second antenna radiating a signal to a front area. Therefore, the second antenna module ANT2 may perform communication with the set-top box STB or the AP through the first antenna, and perform communication with one of the mobile terminals UE1 and UE2 through the second antenna.

Meanwhile, one of the mobile terminals UE1 and UE2 may be configured to perform MIMO with the electronic device. As one example, the UE1 may be configured to perform MIMO while performing beamforming with the electronic device. As aforementioned, the electronic device corresponding to the image display device may perform high-speed communication with another electronic device or set-top box through a WiFi wireless interface. As one example, the electronic device may perform high-speed communication with another electronic device or set-top box at 60 GHz through 802.11ay wireless interface.

In the meantime, the transceiver circuit modules 1210a to 1210d may operate to process transmission signals and reception signals at RF frequency bands. Here, the RF frequency bands, as aforementioned, may be arbitrary mmWave frequency bands, such as 28 GHZ, 39 GHZ, and 64 GHz. The transceiver circuit modules 1210a to 1210d may be referred to as RF sub-modules 1210a to 1210d. At this time, the number of RF sub-modules 1210a to 1210d may not be limited to four, but may vary to an arbitrary number more than two depending on an application.

Also, the RF sub-modules 1210a to 1210d may include an up-conversion module and a down-conversion module that convert a signal of an RF frequency band into a signal of an IF frequency band or a signal of an IF frequency band into a signal of an RF frequency band. To this end, the up-conversion module and the down-conversion module may include a local oscillator (LO) that can perform up-frequency conversion and down-frequency conversion.

The plurality of RF sub-modules 1210a to 1210d may be configured such that a signal is transmitted from one of the plurality of transceiver circuit modules to an adjacent transceiver circuit module. Accordingly, the transmitted signal can be transmitted at least one time to all of the plurality of transceiver circuit modules 1210a to 1210d.

To this end, a data transfer path in a loop structure may be additionally provided. In this regard, the adjacent RF sub-modules 1210b and 1210c may be allowed to perform a bi-directional signal transfer through a transfer path P2 with the loop structure.

Or, a data transfer path in a feedback structure may be additionally provided. In this regard, at least one RF sub-module 1210c is allowed to perform a uni-directional signal transfer to the other RF sub-modules 1210a, 1210b, and 1210c through the data transfer path with the feedback structure.

The plurality of RF sub-modules may include a first RF sub-module to a fourth RF sub-module 1210a to 1210d. In this regard, a signal may be transferred from the first RF sub-module 1210*a* to the adjacent second RF sub-module 1210B and fourth RF sub-module 1210*d*. Also, the second RF sub-module 1210*b* and the fourth RF sub-module 1210*d* may transfer the signal to the third RF sub-module 1210*c*. At this time, when the second RF sub-module 1210*b* and the third RF sub-module 1210*c* are available to transmit signals bidirectionally, it may be referred to as the loop structure. On the other hand, when the second RF sub-module 1210*b* and the third RF sub-module 1210*c* are available to merely transmit signals unidirectionally, it may be referred to as the feedback structure. In the feedback structure, at least two signals may be transferred to the third RF sub-module 1210*c*.

However, with no limit to this, the baseband module may be disposed in a specific module of the first to fourth RF sub-modules 1210*a* to 1210*d* depending on applications. Or, depending on applications, the baseband module may not be disposed in the first to fourth RF sub-modules 1210*a* to 1210*d*, but may be configured as a separate controller, namely, a baseband processor 1400. For example, a control signal transfer may alternatively be carried out only by the separate controller, namely, the baseband processor 1400.

Figure 3A:
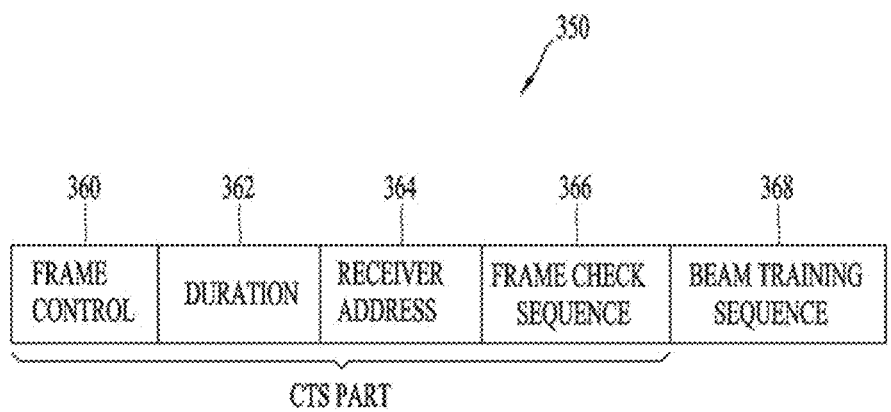
Figure 3B:
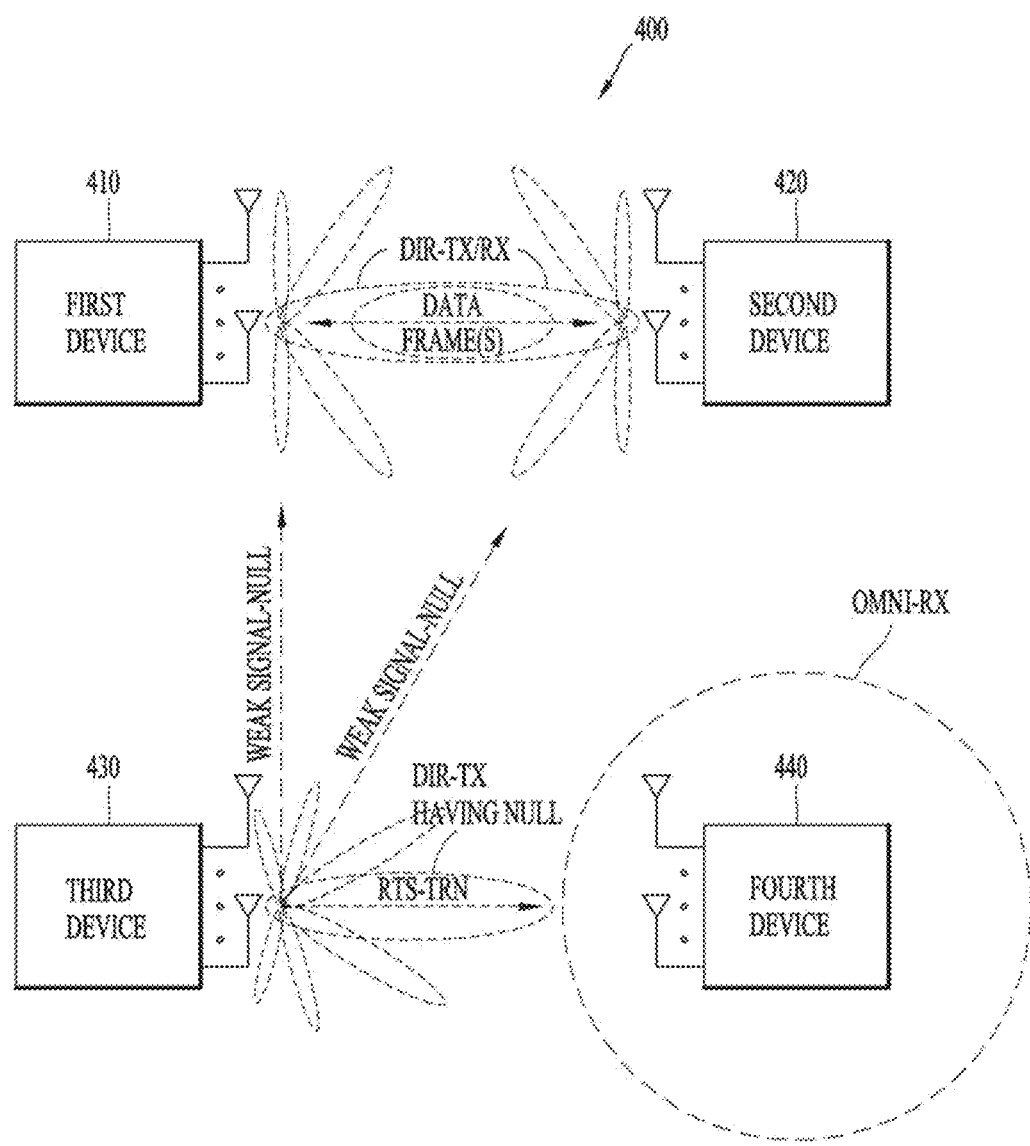
FIG. 3B is a block diagram illustrating a communication system 400 according to an example of the present disclosure.

Hereinafter, a description will be given of detailed configuration and functions of the electronic device having antennas that may be disposed inside or on side surfaces of the multi-transceiver system as illustrated in FIG. 3 and the electronic device of FIG. 4, in the electronic device as illustrated in FIGS. 1 to 2.

The electronic device such as the image display device may include a communication module having antennas to perform communications with neighboring electronic devices. Meanwhile, as a display area (region) of an image display device is expanded recently, a disposition space of a communication module including antennas is reduced. This causes an increase in necessity of disposing antennas inside a multi-layered circuit board on which the communication module is implemented.

A WiFi radio interface may be considered as an interface for a communication service between electronic devices. When using such a WiFi radio interface, a millimeter wave (mmWave) band may be used for high-speed data transmission between the electronic devices. In particular, the high-speed data transmission between the electronic devices is achieved using a radio interface such as 802.11ay.

Hereinafter, a description will be given of detailed configuration and functions of the electronic device as illustrated in FIG. 1, having wireless interfaces as illustrated in FIG. 2. Electronic devices are needed to transmit or receive data therebetween using communication services at an mmWAve band. In this regard, wireless audio-video (AV) service and/or high-speed data transmission may be provided by using 802.11ay wireless interface as the mmWave wireless interface. In this case, the mmWAve wireless interface is not limited to the 802.11ay wireless interface, but an arbitrary wireless interface of 60 GHz may be applied. In this regard, a 5G or 6G wireless interface that uses 28 GHz band or 60 GHz band may alternatively be used for high-speed data transmission between electronic devices.

There is no detailed solution to antenna and radio frequency integrated chip (RFIC) providing a wireless interface in an electronic device such as an image display device for transferring images with resolution over 4K. Specifically, considering a situation that the electronic device such as the image display device is disposed on a wall of a building or a table, the electronic device is needed to transmit or receive wireless AV data to or from another electronic device. To this end, a detailed configuration and antenna structure for determining an area of the image display device to dispose the antenna and RFIC should be proposed.

Figure 5A:
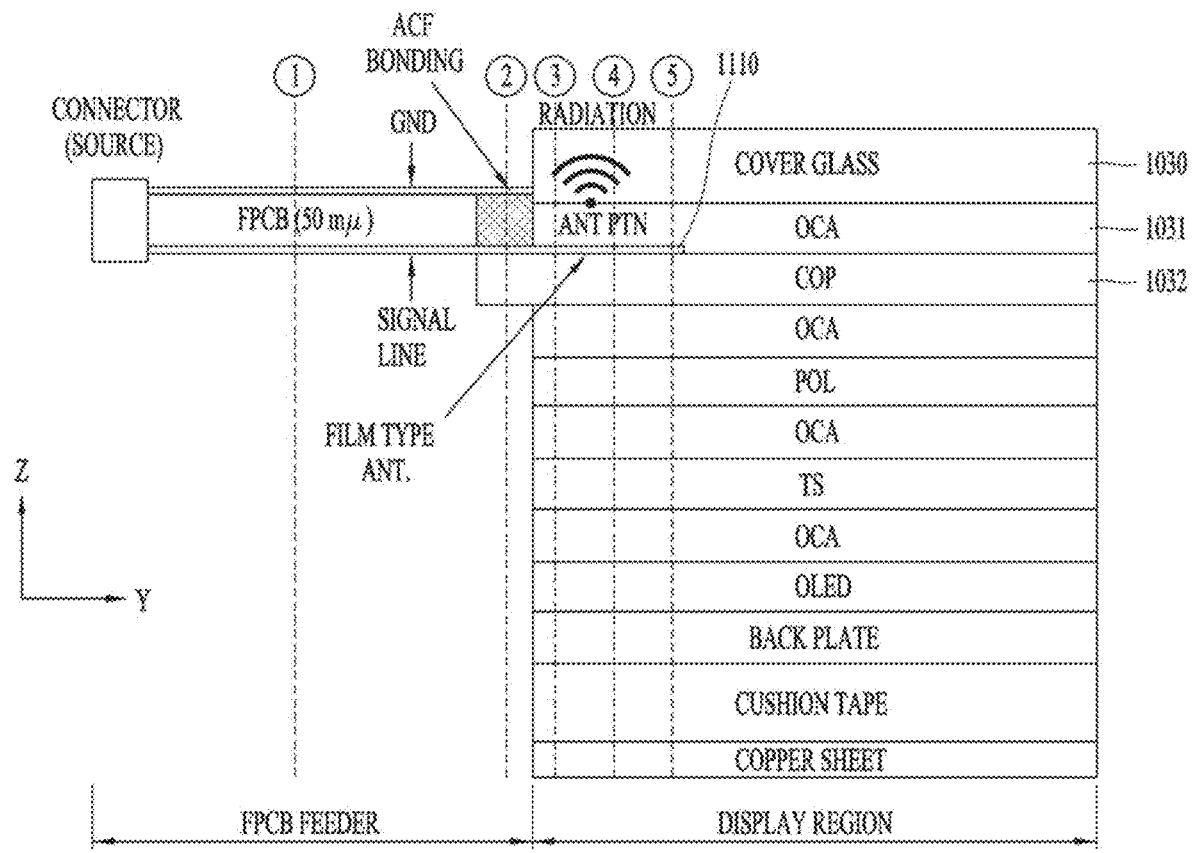
FIG. 5A is a configuration view illustrating that an in-display antenna is connected to an FPCB in accordance with one embodiment. Also.
Figure 5B:
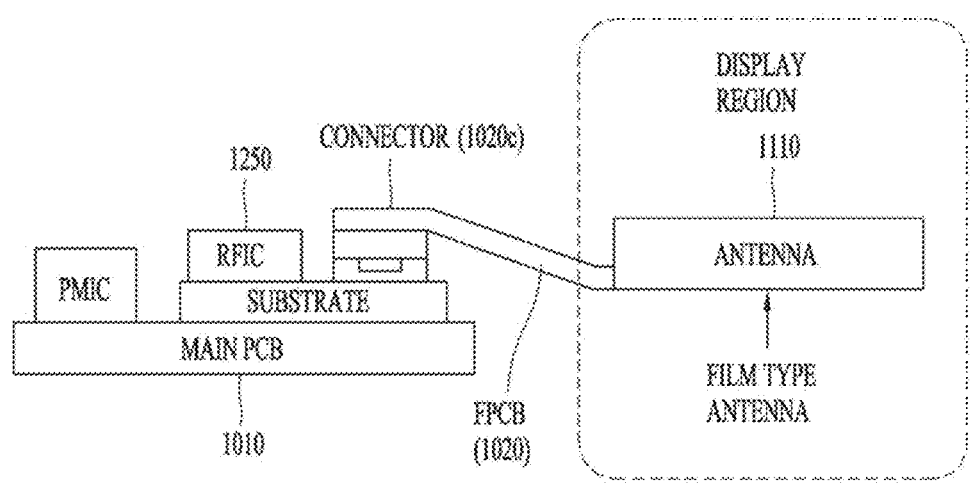
FIG. 5B is a configuration view illustrating that the FPCB connected to the in-display antenna is connected to a main PCB in accordance with one embodiment.

In this regard, FIG. 5A is a configuration view illustrating that an in-display antenna is connected to an FPCB in accordance with one embodiment. Also, FIG. 5B is a configuration view illustrating that the FPCB connected to the in-display antenna is connected to a main PCB in accordance with one embodiment.

Referring to FIG. 5A, an in-display antenna 1110 may be formed as a thin film between an optically clear adhesive (OCA) layer and a cyclo olefine polymer (COP) layer disposed beneath a cover glass of the display 151. Meanwhile, a copper sheet on a lower end of the display 151 is a copper on a lower end of an OLED panel and may operate as a ground plane of the in-display antenna 1110.

Hereinafter, a display structure having transparent antennas therein will be described. Referring to FIG. 5A, a COP layer may be disposed on an OLED display panel and an OCA inside the display. Here, a dielectric in the form of a film, such as the COP layer, may be used as a dielectric substrate of a transparent antenna module. In addition, an antenna layer may be disposed on the dielectric in the form of the film. Here, the antenna layer may be made of alloy (Ag alloy), copper, aluminum, or the like. In some examples, the in-display antenna 1110 and a transmission line may be disposed on the antenna layer.

In relation to the in-display antenna 1110 according to one embodiment, a metal pattern of a feeder may be bonded to CPW feeder 1121 through an anisotropic conductive film (ACF) in a CPW area. Here, since the ACF bonding is performed in the CPW area, it is advantageous that an electrical loss at a disconnected point can be reduced by the ground (GND) pattern in the CPW area.

Also, the ACF bonding point may be selected as a point 2) among points 1) to 5). Accordingly, as the ACF bonding point is selected as the point 2) that is a boundary between a transparent area and an opaque area of the display, the CPW feeder 1121 such as a feed line may be disposed on the opaque area. On the other hand, a transparent film radiator, such as the in-display antenna 1110, may be disposed on the transparent area.

Referring to FIG. 5B, the in-display antenna 1110 may be connected to a main PCB through an FPCB. In this regard, the in-display antenna 1110 may be connected to the main PCB through a connector that is connected to an end portion of the FPCB. In this case, the connector may be electrically connected to a substrate disposed on the main PCB. Accordingly, the in-display antenna 1110 may be connected to a transceiver circuit 1250 disposed on the main PCB through the FPCB. Also, a power management integrated circuit (PMIC) may be disposed on the main PCB to supply power to the transceiver circuit 1250 or the baseband processor 1400 and control/manage the supplied power.

In short, to supply a signal to a film-type antenna designed on a single layer according to the present disclosure, a feed line transition step to be explained hereinafter may be performed. The feed line transition step may be carried out through the connector (in contact with the main PCB)*?* (microstrip line)→? ACF bonding (CPW-G; Coplanar Waveguide having a ground plane)*?*film-type antenna (1 layer).

Meanwhile, in relation to the in-display antenna of the film-type antenna structure according to the present disclosure, the copper foil on the lower end of the OLED panel plays a role of a ground plane of a film-type patch antenna, which may result in securing high directionality toward the front surface of the display.

Also, the in-display antenna proposed in the present disclosure can steer beams through a phase delay circuit, and may operate in a vertical/horizontal polarization mode according to a feed line configuration.

Hereinafter, 1) a signal line as an FPCB feed line in an external area of a display will be described with reference to FIGS. 5A and 5B. In this regard, the FPCB feed line is a microstrip line-based signal line and may transfer a signal applied from a source to the antenna. As one example, a top surface of the FPCB is a ground plane, a bottom surface is a signal line, and an electric field distribution of a cross-section may be the same as or similar to an electric field distribution of a microstrip line. As another example, a bottom surface of the FPCB is a ground plane, a top surface is a signal line, and an electric field distribution of a cross-section may be the same as or similar to an electric field distribution of a microstrip line.

Hereinafter, 2) a bonding portion between the FPCB and the COP, which corresponds to a connection portion between a FPCB feed line and the in-display antenna will be described. In this regard, the FPCB signal line and a film-type antenna may be bonded to each other through ACF bonding. For the ACF bonding, it has a co-planar waveguide with ground (CPW-G) type structure and is similar to an electric field distribution of a microstrip line. Also, the CPW-G is insensitive to the changes of characteristic impedance due to external factors such as structural changes, coupling, process errors, etc., compared to the microstrip line or CPW structure. Therefore, the CPW-G structure has a stable transition characteristic at the bonding portion between the signal line and the antenna.

Hereinafter, an antenna module having a display-embedded antenna and an electronic device including the same according to the present disclosure will be described in detail with reference to the drawings.

Figure 6:
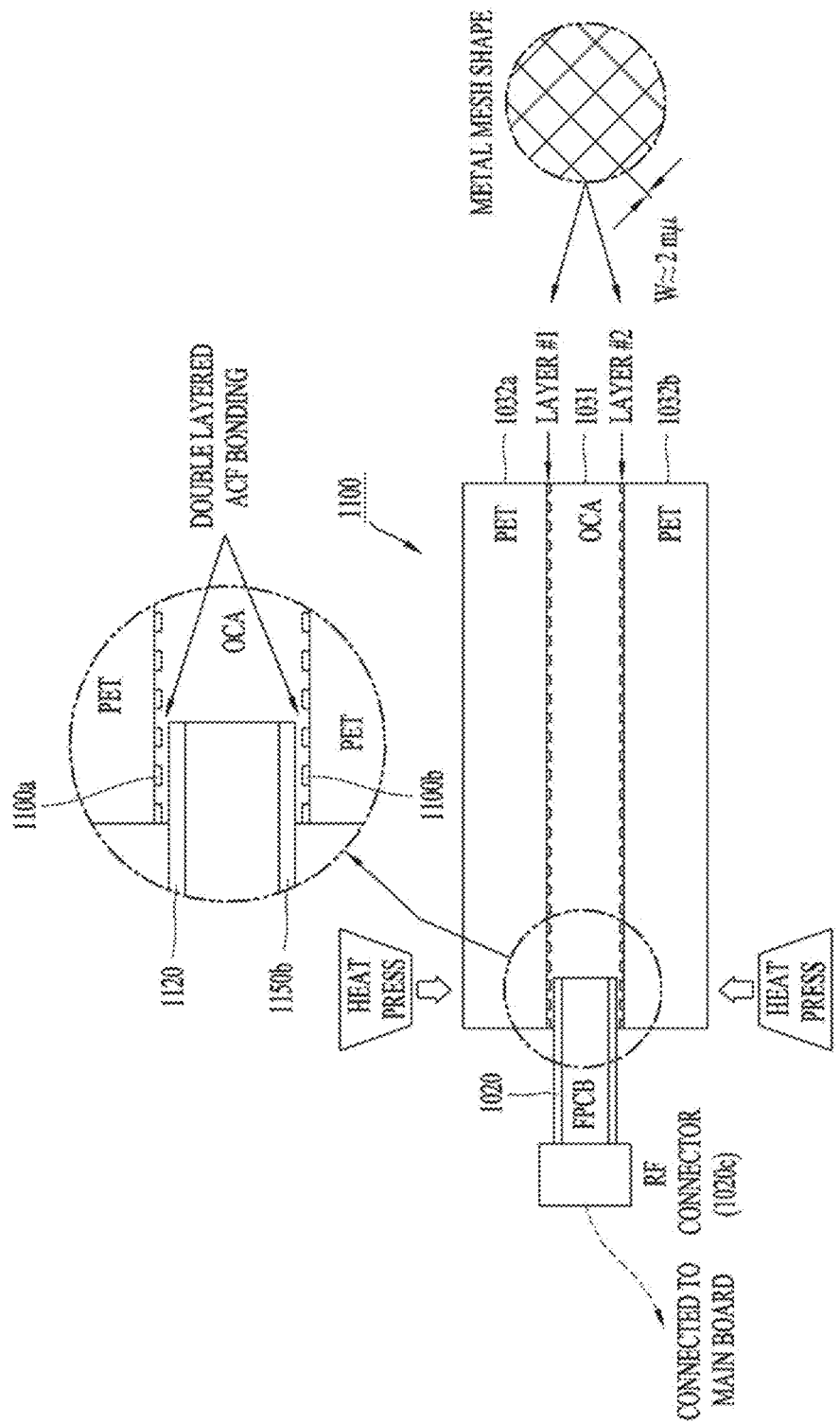
FIG. 6 is a configuration diagram of an antenna module disposed on a display disclosed herein.
Figure 7:
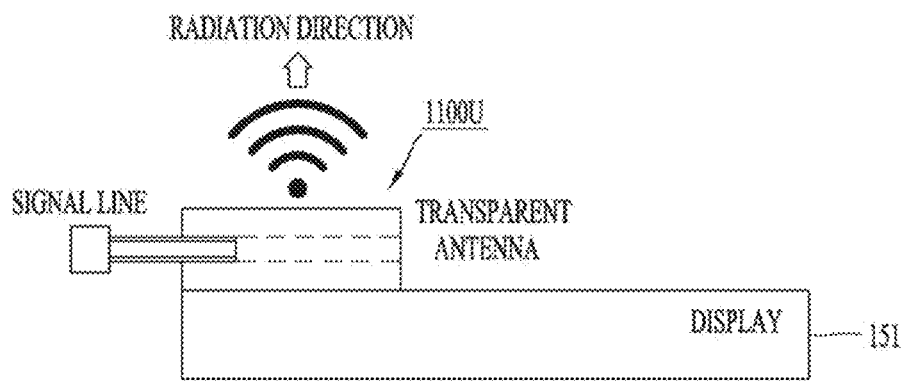
FIG. 7 is a view illustrating a configuration in which an antenna module is disposed on a display according to various embodiments.
Figure 7:
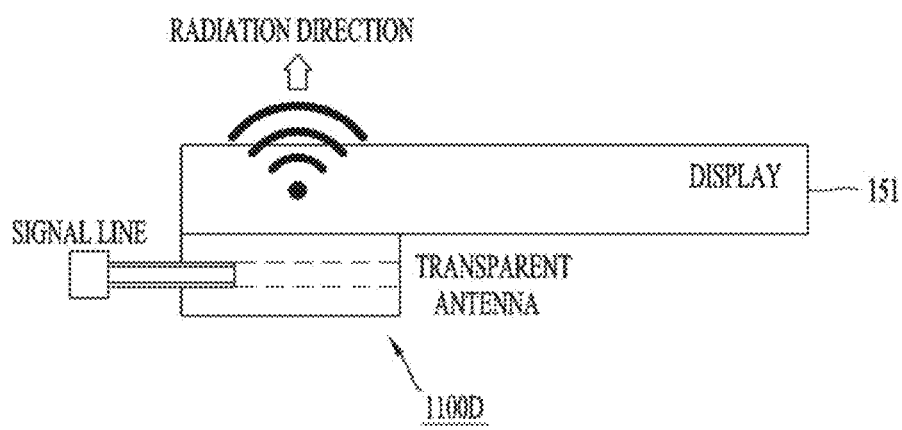
Figure 7:
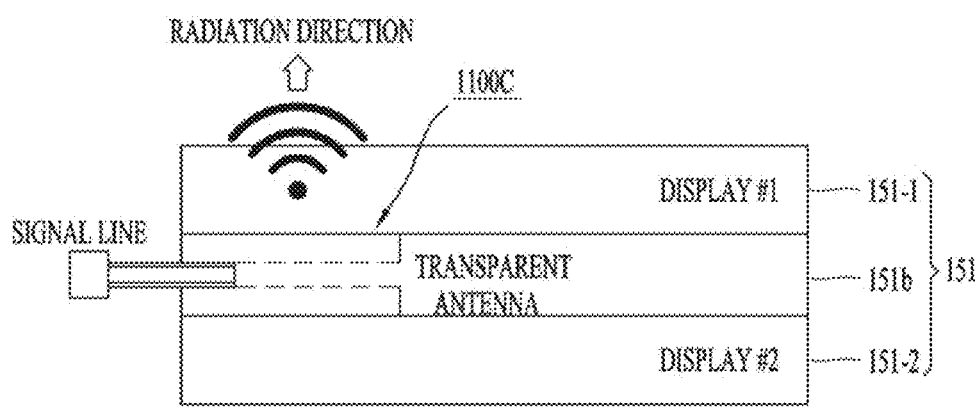

FIG. 6 is a configuration diagram of an antenna module disposed on a display disclosed herein. FIG. 7 is a view illustrating a configuration in which an antenna module is disposed on a display according to various embodiments.

Referring to FIG. 6, a double-layered type antenna design and a signal line connection structure to be applied to a display are disclosed. Referring to FIGS. 5B and 6, when the antenna module 1100 is connected to a signal line substrate (FPCB) 1020 for connection to the main PCB 1010, an OCA layer 1031 that is made of an optical adhesive may be used. The OCA layer 1031 used may have a thickness equal to that of the FPCB 1020.

PET layers 1032a and 1032b may be disposed on top and bottom of the OCA layer 1031. The PET layers 1032a, 1032b corresponding to two thin films or transparent antennas printed on the COP layer may be attached on both surfaces of an adhesive, and connected to be in contact with both ends of a feed line. At this time, the top and bottom surfaces where the feed line and the transparent antennas come into contact may be bonded and electrically connected through ACF bonding.

Transparent electrodes printed on two thin films may operate as antennas that serve as a radiator 1100a and a ground plane 1100b, respectively. The transparent electrodes serving as the radiator 1100a and the ground plane 1100b may be formed in a metal mesh shape.

The transparent electrodes configured as the radiator 1100a and the ground plane 1100b may be referred to as a first metal mesh layer 1100a and a second metal mesh layer 1100b, respectively. Alternatively, the transparent electrodes configured as the radiator 1100a and the ground plane 1100b may be referred to as a first metal mesh pattern 1100a and a second metal mesh pattern 1100b, respectively. By using the characteristics of an antenna, which has a strong directivity toward the outside of the display, the back-radiation of radio waves toward the inside of the display can be dramatically reduced and antenna radiation efficiency can be greatly increased. In addition, current leaking into the display can be blocked, thereby protecting internal circuits and avoiding interference.

Accordingly, the main configuration of the double-layered transparent antenna structure according to the present disclosure will be described as follows, but is not limited thereto. 1) The double-layered transparent antenna structure may include a first ground pattern formed with being separated from a mesh-type radiator disposed on one side of a first dielectric 1032a corresponding to a first film by a gap in a radiator region. 2) It may include a mesh-type second ground pattern disposed on another side of a second dielectric 1032b corresponding to a second film.

In this regard, the one side of the first dielectric 1032a and the another side of the second dielectric 1032b may be regions facing each other, and may be formed in a double-layered structure coupled by the OCA layer 1031. In the double-layered structure, an FPCB 1020 corresponding to a connection PCB connected to an external PCB may be inserted between the first dielectric 1032a and the second dielectric 1032b. The first ground pattern may be formed as a floating ground region, and the second ground pattern may be directly connected to the ground region of the FPCB 1020.

(a) to (c) of FIG. 7 illustrate transparent antenna structures of a first external attachment type, a second external attachment type, and an internal insertion type. The first external attachment type and the second external attachment type may be configured as an on-display structure and an under-display structure, respectively. The internal insertion type may be configured as an in-display structure.

Referring to (a) of FIG. 7, the on-display structure may be a method of attaching a transparent antenna 1100U to the outer wall of the display 151. Since there is no interference with the display layer 151 in an antenna radiation direction of a boresight direction, the on-display structure may be configured to achieve the highest radiation efficiency/gain. However, because the antenna structure is exposed to the outside, physical friction and contact may occur.

Referring to (b) of FIG. 7, the under-display structure may be a method of attaching a transparent antenna 1100D to the inner wall of the display 151. Since the display layer 151 is disposed on top in the antenna radiation direction of the boresight direction, insertion loss may occur depending on the display properties, causing the reduction of radiation efficiency/gain. However, because the antenna structure is not exposed to the outside, physical friction and interference from the outside of the display are reduced.

Referring to (c) of FIG. 7, the in-display structure may be a method of inserting a transparent antenna 1100C between two layers of displays 151-1 and 151-2. In order to insert and fix the transparent antenna 1100C between the displays 151-1 and 151-2, a bonding member 151b such as transparent adhesive may be disposed between the two display layers 151-1 and 151-2. Radiation efficiency/gain may be reduced due to display interference in the antenna radiation direction of the boresight direction, but the antenna structure may not be exposed inside/outside the display. Accordingly, the in-display structure may have the lowest risk from external impact.

In this regard, the display antenna disclosed herein may be implemented in any one of the on-display structure, under-display structure, and in-display structure of (a) to (c) of FIG. 7 depending on applications. Accordingly, the display antenna implemented as a transparent antenna may be implemented as one of first to third antenna modules 1100U, 1100D, and 1100C disposed on the upper region of a display, on the lower region of a display, and between displays.

Meanwhile, the display antenna disclosed herein may be configured to operate in an mmWave band. In this regard, the display antenna disclosed herein may be configured to operate at 60 GHz as well as 28 GHz. Therefore, the display antenna disclosed herein may alternatively be configured to perform wireless communication between devices by using the band of 60 GHZ in IPTV.

The present disclosure proposes an idea related to designing a transparent display antenna capable of being applied to a full-screen display. Therefore, the present disclosure is to propose a technology of designing a dual-polarized array antenna capable of reinforcing directionality of radio waves toward the front surface of a display while maintaining a product design.

To this end, an antenna is implemented in a single-layered coplanar metal mesh shape on a thin film in an etching manner, and accordingly an ultra-thin transparent antenna capable of being inserted into a display can be designed. Also, an array antenna supporting a dual polarization mode can be implemented within a very small space, thereby shortening a signal path between a feed line and a driving circuit and remarkably reducing propagation path loss.

The transparent display antenna proposed in the present disclosure may implement dual polarization characteristics by arraying patch antennas having vertical/horizontal polarization characteristics. To improve isolation between antennas and equalize radiation patterns of unit elements, a dummy element and a dummy port may be configured.

The structure and radiation pattern of the double-layered antenna disclosed herein will be described by comparison with the structure and radiation pattern of a single-layered antenna. In this regard, a transparent antenna may adopt a structure in which a radiator is disposed on one of both surfaces of a dielectric such as PET and a ground pattern is disposed on another surface, but a transparency issue may occur. Meanwhile, due to the transparency issue, a single-layered transparent antenna, for example, a transparent antenna with a slot structure, may be considered. However, a transparent antenna with a slot structure radiates to the front and rear surfaces, which may cause an issue with radiation performance. Considering this, the present disclosure proposes a structure in which a radiator and a ground pattern are individually disposed on respective PETs, namely, dielectric regions and bonded with OCA.

Figure 8A:
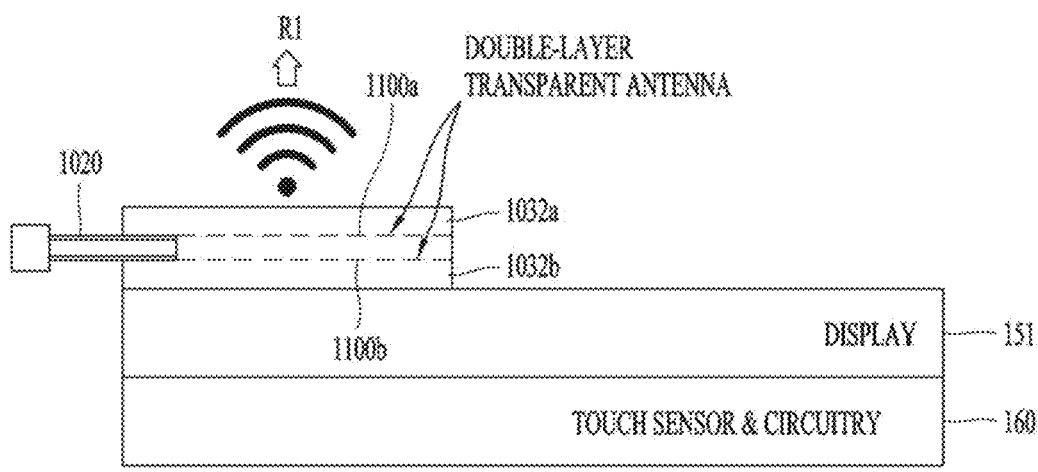
FIGS. 8A and 8B illustrate the structures and radiation patterns of a double-layered antenna and a single-layered antenna.
Figure 8B:
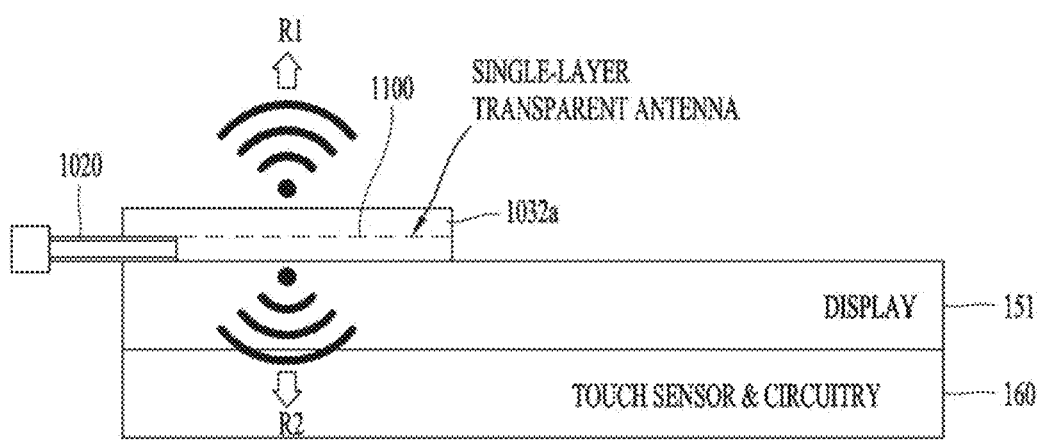

In this regard, FIGS. 8A and 8B illustrate the structures and radiation patterns of a double-layered antenna and a single-layered antenna. Specifically, FIG. 8A illustrates the structure and radiation pattern of the double-layered antenna disclosed therein. On the other hand, FIG. 8B illustrates the structure and radiation pattern of the single-layered antenna.

Referring to FIG. 8A, the double-layered antenna may be configured as a patch antenna that metal mesh patterns 1100a and 1100b corresponding transparent electrodes printed on thin films 1032a and 1032b serve as a radiator and a ground plane, respectively. An electrode facing a touch sensor/circuitry 160 may be configured as a ground plane, and an electrode facing the outside of the display 150 may be configured as a radiator.

Since the double-layered transparent antenna radiates radio waves in a single direction, it may transmit and receive strong radio waves in a target direction. Accordingly, the double-layered transparent antenna may realize high antenna gain (efficiency). In addition, current leaking into the display 151 can be blocked, thereby protecting internal circuits and avoiding interference.

Referring to FIG. 8B, the single-layered antenna radiates signals in a direction toward an internal circuit, when applied to a display, due to a structural limitation of having a bi-directional radiation pattern. Additionally, because signals are radiated bidirectionally, the gain of an antenna facing the outside of the display (target direction) may be halved. For example, the gain of the single-layered antenna may be reduced to about ½ the gain of the double-layered antenna.

Referring to FIGS. 8A and 8B, the touch sensor of the touch sensor/circuitry 160 may also be configured with a metal mesh pattern. In this regard, the grid structures of the first and second metal mesh patterns 1100a and 1100b of FIG. 8A may be formed differently from the grid structure of the touch sensor.

In this regard, the grid structures of the first and second metal mesh patterns 1100a and 1100b may be formed so that the size of a unit cell is smaller than the size of a unit cell of the touch sensor in order to form an antenna pattern in a 60 GHz band. For example, the size of a second unit cell of the touch sensor may be formed to be as large as an integer multiple of the size of a first unit cell of the first and second metal mesh patterns 1100a and 1100b. The second intersection point of a second grid structure of the touch sensor may be different from the first intersection point of a first grid structure of the first and second metal mesh patterns 1100a and 1100b. This can suppress changes in antenna performance due to a touch by the touch sensor. This can also suppress deterioration of touch performance depending on an antenna operation.

Meanwhile, the second metal mesh pattern 1100b for the double-layered antenna structure may operate as a ground pattern. Accordingly, interference between the touch sensor/circuitry 160 and the first metal mesh pattern 1100a where the antenna pattern is formed can be suppressed.

As described above, a double-layered antenna may be implemented as a patch antenna having a radiator and a ground plane. On the other hand, a single-layered antenna may be implemented as a slot antenna implemented on a ground plane. For comparison of radiation characteristics with a single-layered display antenna, performance may be compared under the same or similar conditions as a double-layered display antenna. A single-layered display antenna may be implemented as a slot antenna, and a double-layered display antenna may be implemented as a patch antenna. The gain of a single-layered slot antenna with a bidirectional radiation pattern may be about 5.7 dBi. On the other hand, the gain of a double-layered patch antenna with a unidirectional radiation pattern may be about 8.5 dBi. Therefore, the gain of the single-layered slot antenna may be about 2.8 dB lower than the gain of the double-layered patch antenna.

Figure 9A:
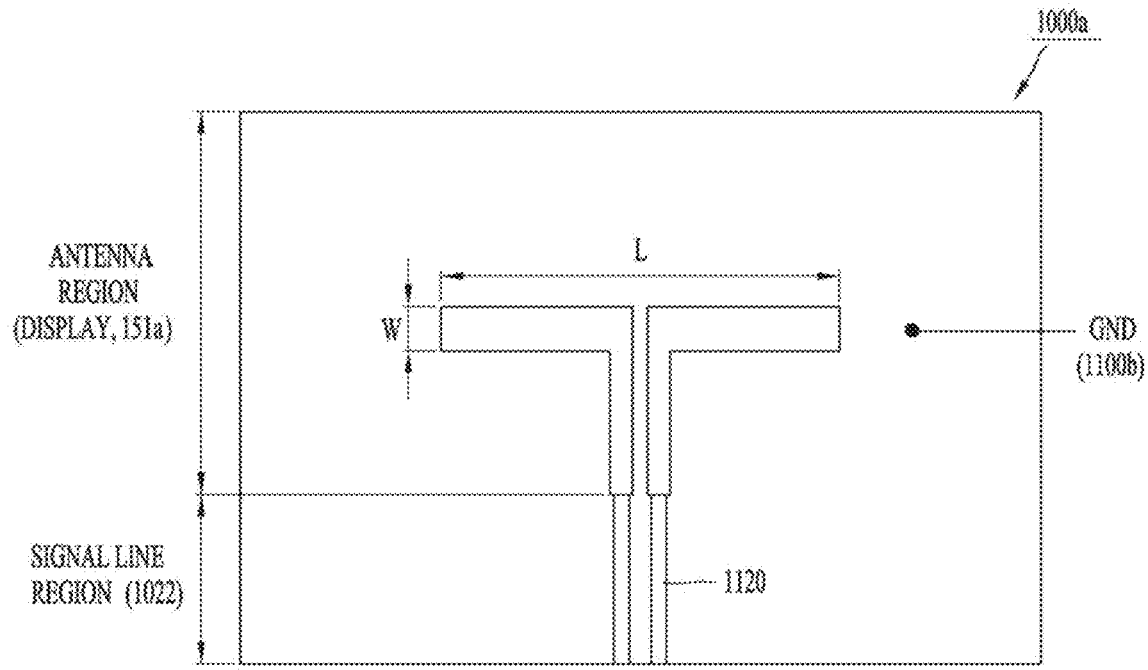
FIGS. 9A and 9B illustrate the shape/structure and radiation pattern of a patch antenna as a double-layered antenna.
Figure 9B:
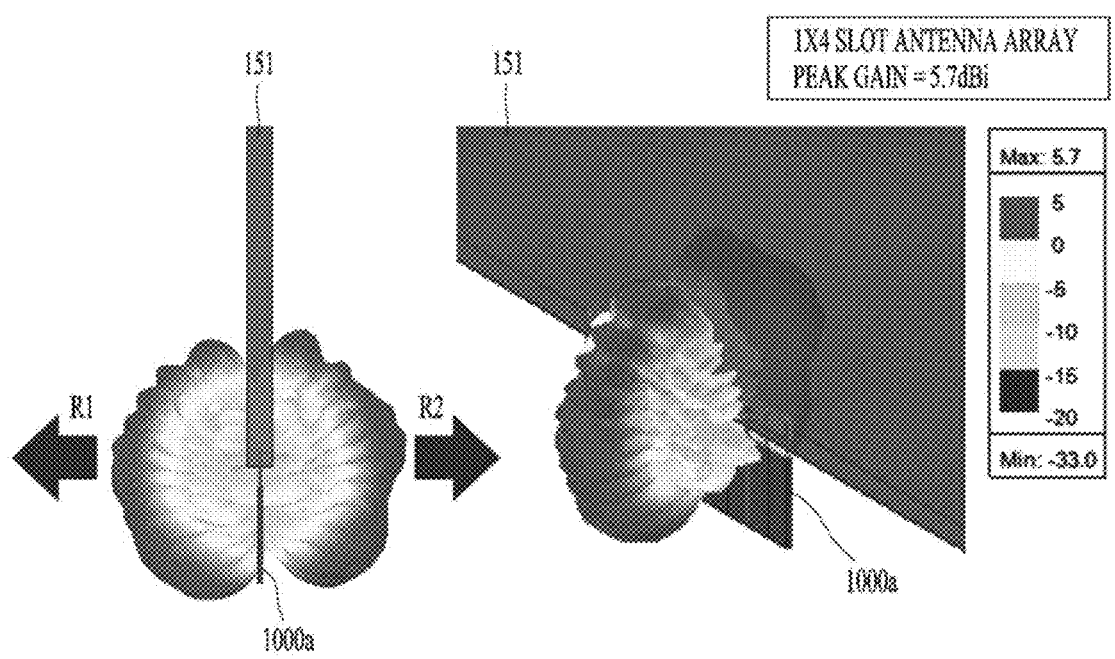
Figure 10A:
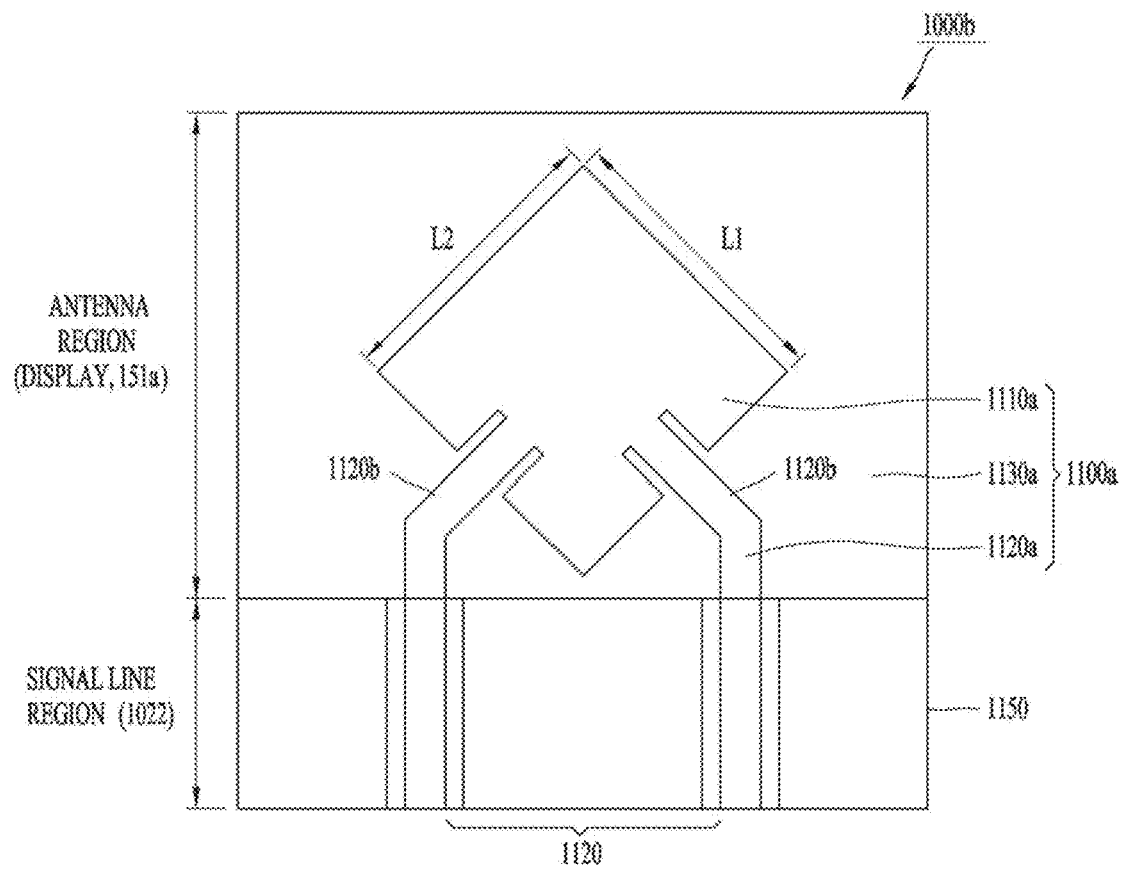
FIGS. 10A and 10B illustrate the shape/structure and radiation pattern of a patch antenna as a single-layered antenna.
Figure 10B:
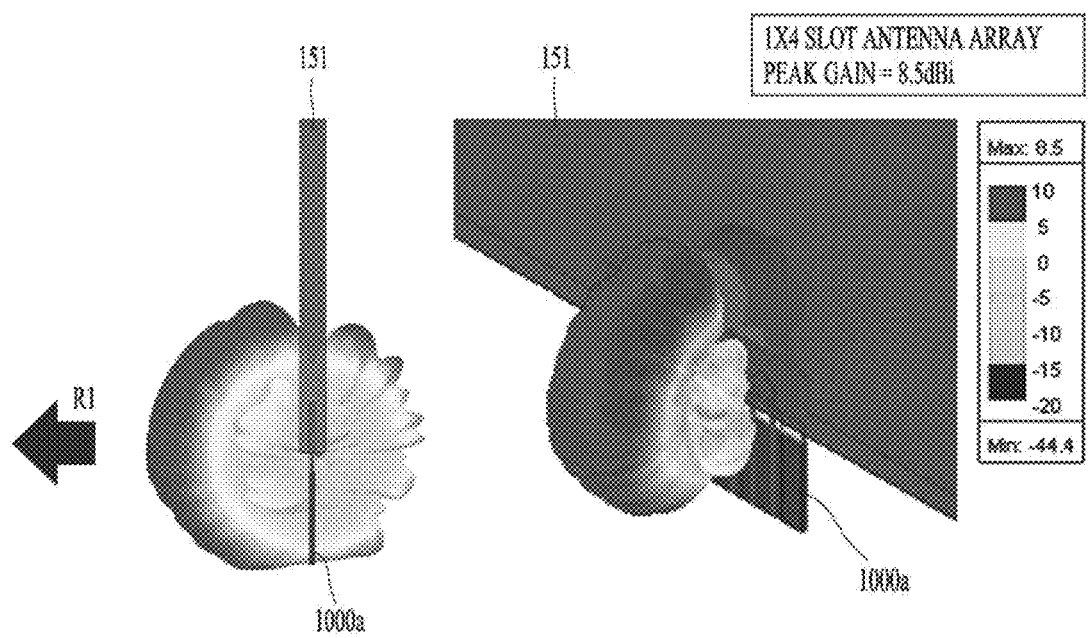

Meanwhile, the shape/structure and radiation pattern of a patch antenna as a double-layered antenna disclosed herein will be described by comparing with the shape/structure and radiation pattern of a slot antenna as a single-layered antenna. In this regard, FIGS. 9A and 9B illustrate the shape/structure and radiation pattern of a patch antenna as a double-layered antenna. On the other hand, FIGS. 10A and 10B illustrate the shape/structure and radiation pattern of a patch antenna as a single-layered antenna.

Referring to FIG. 9A, a single-layered antenna 1000a may be configured to include a display 151a corresponding to an antenna region and a signal line region 1022. An ACF bonding region corresponding to a transition region may be formed between the antenna region 151a and the signal line region 1022. The single-layered antenna 1000a may be a slot antenna in which a slot region is defined in the ground pattern 1100b. A slot antenna may be implemented by a slot region with a predetermined length L and a predetermined width W.

For example, when the slot antenna operates in a 60 GHz band, the length L and width W of the slot region may be 1.2×0.15 mm, but are not limited thereto. The width and length of the slot region which is connected to overlap the feed line 1120 may be 0.06 mm and 0.1 mm, respectively, but are not limited thereto. In the single-layered antenna 1000a, a radiator corresponding to the slot antenna and the ground pattern 1100b may be implemented on the same plane.

Referring to FIG. 9B, an antenna module 1000a may be disposed on the lower region of the display 151 of the electronic device. A radiation pattern may be formed in both the front region R1 and the rear region R2 of the display 151 through the antenna module 1000a implemented as a single-layered antenna. Accordingly, a bidirectional radiation pattern may be formed by the single-layered antenna. As an example, the single-layered antenna 1000a may be implemented as a 1×4 array antenna. The gain of the single-layered antenna 1000a may be about 5.7 dBi, as described above.

Referring to FIG. 10A, a double-layered antenna 1000b may be configured to include a display 151a corresponding to an antenna region and a signal line region 1022. An ACF bonding region corresponding to a transition region may be formed between the antenna region 151a and the signal line region 1022. The double-layered antenna 1000b may be a patch antenna in which an antenna pattern 1110a and a feed pattern 1120a are disposed on the display 151a corresponding to the antenna region. The patch antenna may be implemented as a rectangular patch antenna with predetermined lengths L1 and L2. The patch antenna may be implemented in an inset structure in which an inset is formed in a portion connected to the feed pattern 1120a without an impedance matching circuit. The patch antenna may be implemented as a square patch antenna with a predetermined length (L1=L2).

For example, when the patch antenna operates in a 60 GHz band, the length L1, L2 of the patch antenna may be 1.2×1.2 mm, but is not limited thereto. The width and inset spacing of the feed pattern 1120a may be 0.18 mm and 0.06 mm, respectively, but are not limited thereto. The patch antenna may be disposed at an angle rotated by a predetermined angle, but is not limited thereto. The patch antenna may be connected to a first feed pattern 1120a and a second feed pattern 1120b to operate as a dual polarization antenna. The first feed pattern 1120a and the second feed pattern 1120b may be connected to feed lines 1120 formed on the signal line region 1022. The signal line region 1022 may be implemented as a CPW feed line that a ground pattern 1160 is disposed on each of the feed lines 1120, but is not limited thereto.

In the double-layered antenna 1000b, a first metal mesh pattern 1100a including an antenna pattern 1110a, a feed pattern 1120a, and a dummy pattern 1130 may be implemented on a first layer. In the double-layered antenna 1000, a second metal mesh pattern corresponding to a ground pattern may be implemented on a second layer that is the lower region of the first layer. Referring to FIGS. 6, 7, and 10A, the first metal mesh pattern 1100a may be formed on a first dielectric region 1032a. The second metal mesh pattern 1100b may be disposed on a second dielectric region 1032b.

Referring to FIG. 10B, an antenna module 1000b may be disposed in the lower region of the display 151 of the electronic device. A radiation pattern may be formed in the front region R2 of the display 151 through the antenna module 1000b implemented as a double-layered antenna. Accordingly, a unidirectional radiation pattern may be formed by the double-layered antenna. As an example, the double-layered antenna 1000b may be implemented as a 1×4 patch array antenna. The gain of the double-layered antenna 1000b may be about 8.5 dBi, as described above.

The double-layered antenna structure disclosed herein may be implemented on the display region of an electronic device. In this regard, FIG. 11A illustrates a configuration in which a double-layered antenna disclosed herein is disposed on a display region.

Figure 11A:
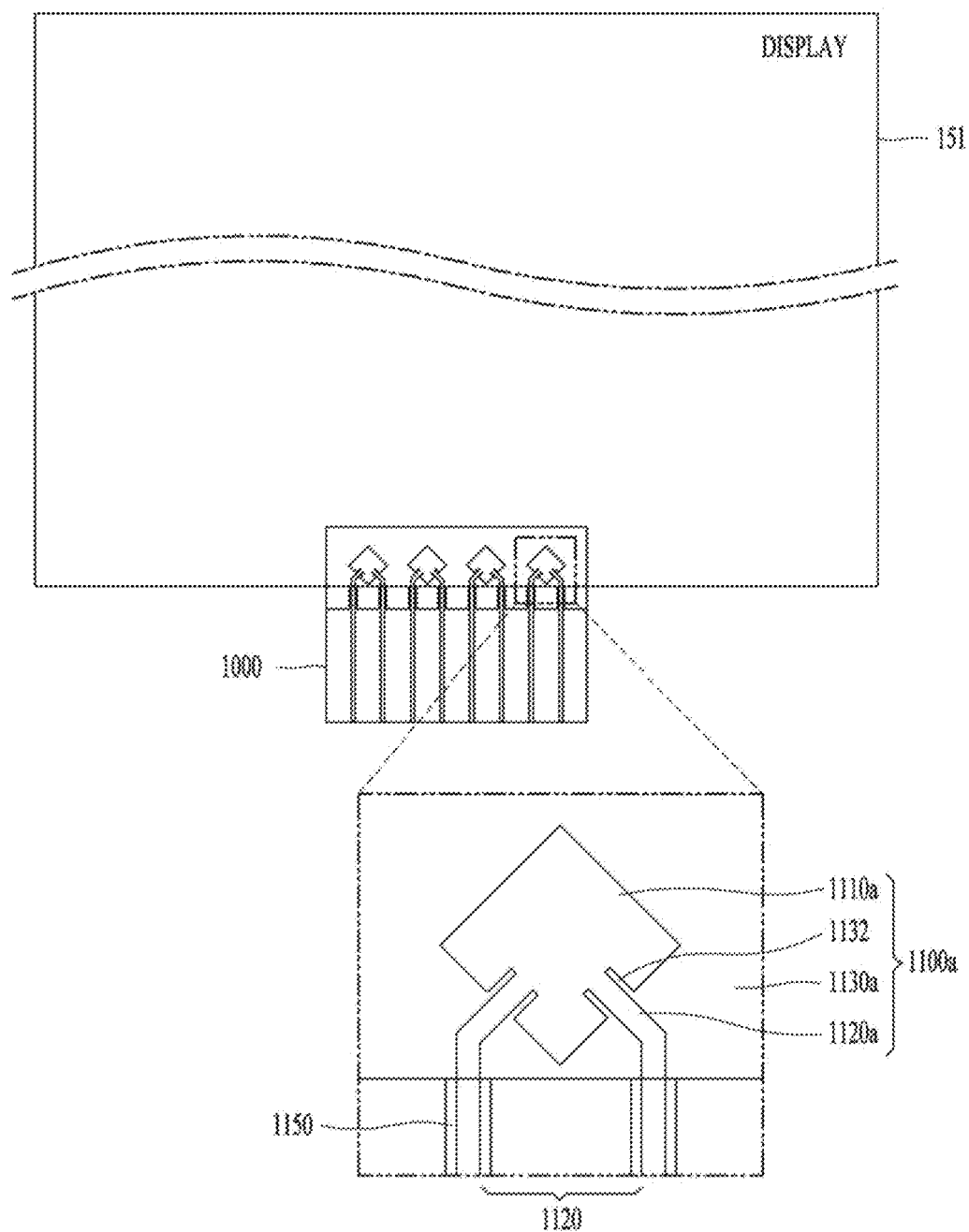
FIG. 11A illustrates a configuration in which a double-layered antenna disclosed herein is disposed in a display region.

Referring to FIG. 11A, a transparent antenna configured as a metal mesh grid in the form of a transparent electrode may be disposed on the lower region of the display 151. The transparent antenna may be formed on the lower region of the display 151, and the feed line 1120 may be formed on a non-transparent region such as an FPCB. The first metal mesh pattern 1100a corresponding to the front region of the double-layered antenna structure may be configured to include an antenna pattern 1110a and a feed pattern 1120a. The first metal mesh pattern 1100a may be configured to further include a dummy pattern 1130a. A second dummy pattern 1132 may be formed on the inset region of the patch antenna.

Hereinafter, the layer structure of a mesh grid structure of a double-layered patch antenna disclosed herein will be described. In this regard, FIG. 11B illustrates the layer structure of a mesh grid structure of a double-layered patch antenna disclosed herein.

Figure 11B:
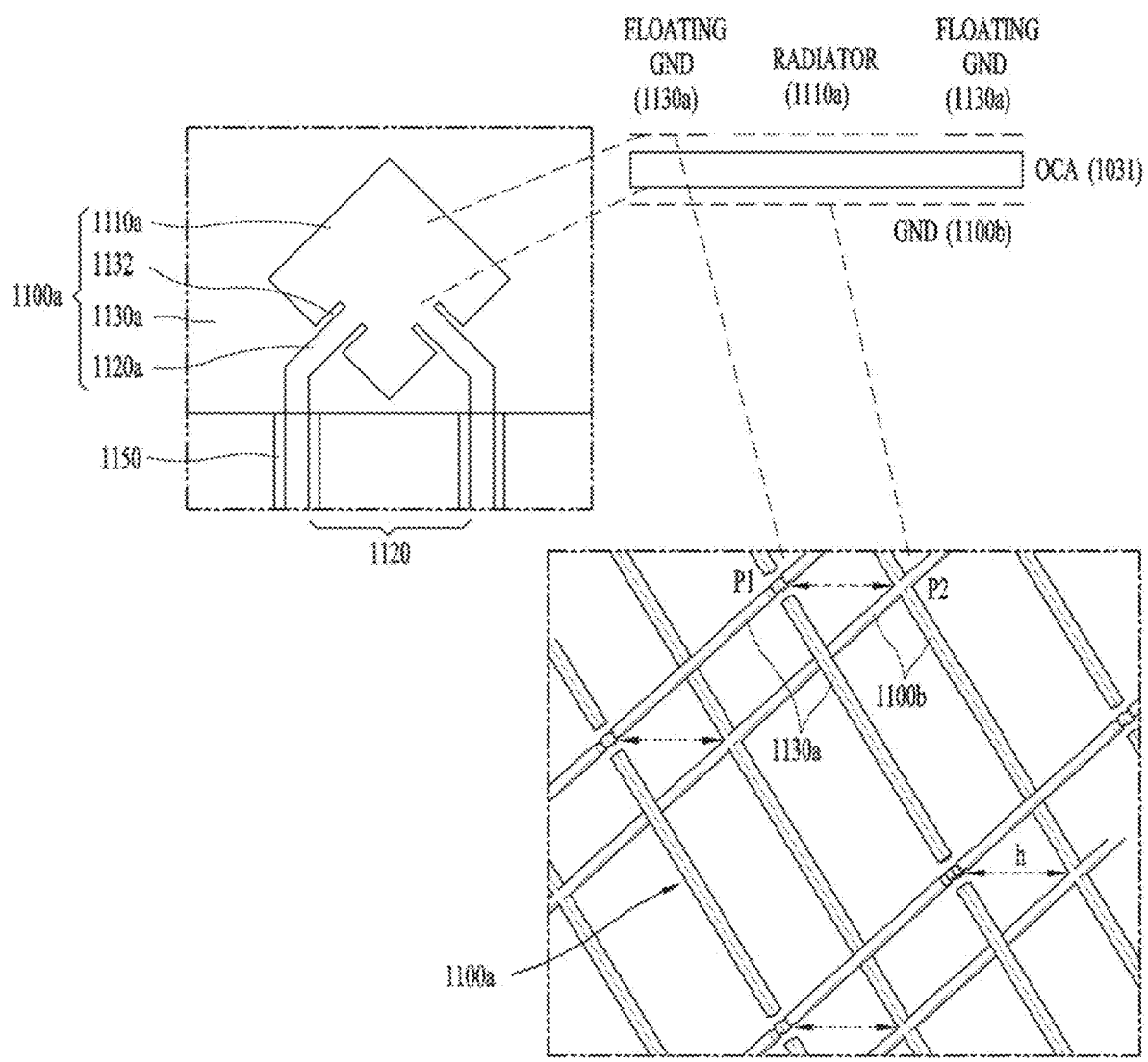
FIG. 11B illustrates the layer structure of a mesh grid structure of a double-layered patch antenna disclosed herein.

Referring to FIG. 11B, the first metal mesh pattern 1100a corresponding to the front region of the double-layered antenna structure may include an antenna pattern 1110a and a dummy pattern 1130a. In this regard, floating ground patterns 1130a may be formed as dummy patterns on both sides of the antenna pattern 1110a. Additionally, the first metal mesh pattern 1100a may include a feed pattern 1120a and a dummy pattern 1130a. In this regard, floating ground patterns 1130a may be formed as dummy patterns on both sides of the feed pattern 1120a. Accordingly, the floating ground patterns 1130a corresponding to the dummy patterns may be disconnected from each other at a first point P1, which is a grid intersection point.

Meanwhile, the second metal mesh pattern 1100b corresponding to the rear region of the double-layered antenna structure may be formed as a ground pattern. An OCA layer 1031 corresponding to an adhesive layer may be disposed between the first metal mesh pattern 1100a disposed on the front region and the second metal mesh pattern 1100b disposed on the rear region.

The second metal mesh pattern 1100b corresponding to the ground pattern may be configured to be electrically connected to the ground region corresponding to the signal line region. The second metal mesh patterns 1100b may be interconnected at a second point P2, which is a grid intersection point. The first point P1 of the floating ground pattern 1130a and the second point P2 of the second metal mesh pattern 1100b may be formed to correspond to each other. The layer structure of the mesh grid structure of the double-layered antenna will be described in detail in FIGS. 16A and 16B.

Figure 12A:
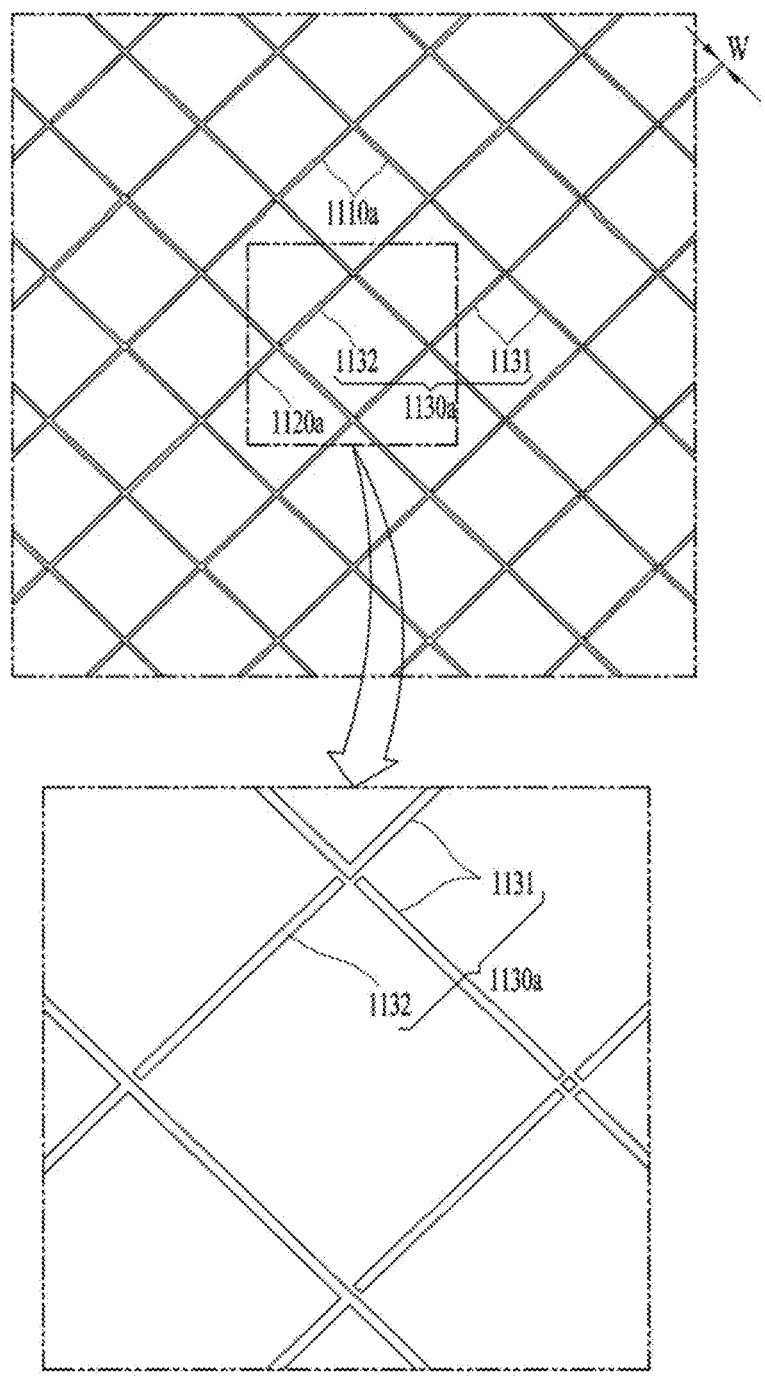
FIGS. 12A and 12B illustrate the metal mesh grid structure of a transparent antenna disclosed herein.
Figure 12B:
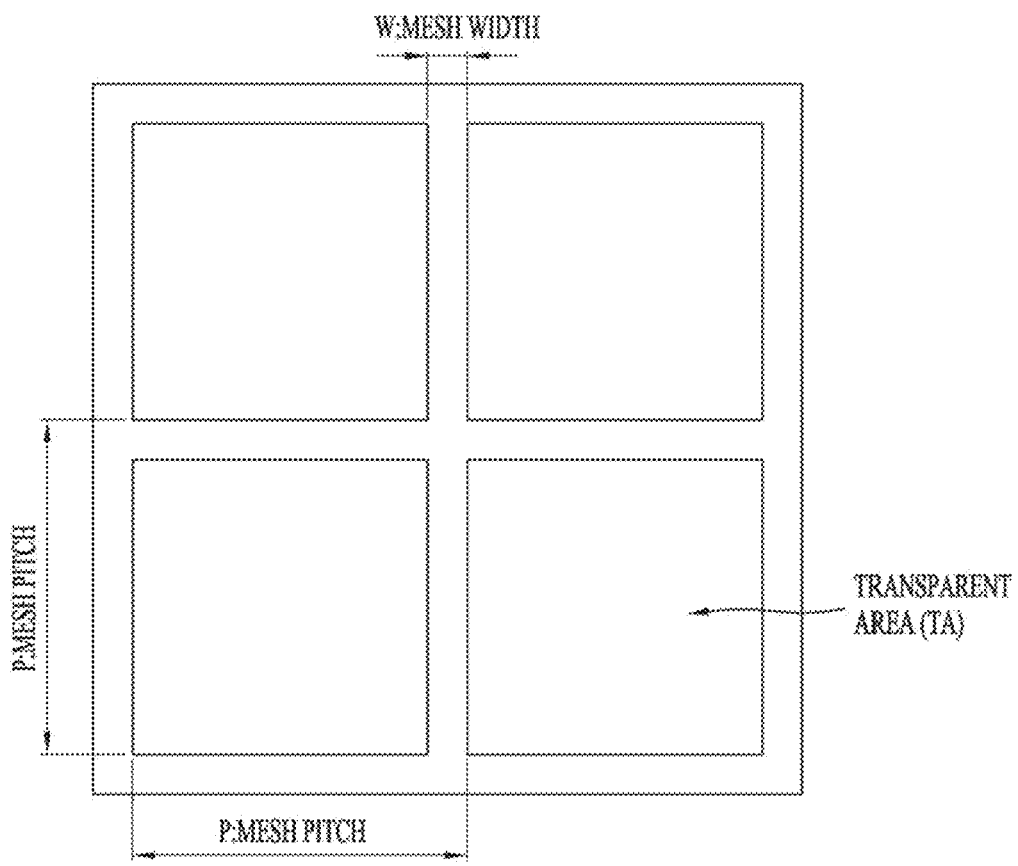

On the other hand, FIGS. 12A and 12B illustrate the metal mesh grid structure of a transparent antenna disclosed herein. Specifically, FIG. 12A illustrates a metal mesh grid structure in which the antenna pattern, feed pattern, and inset region of the patch antenna illustrated in FIGS. 11A and 11B are enlarged. FIG. 12B illustrates a metal mesh grid structure configured as a metal mesh single grid.

Referring to FIG. 12A, the metal mesh grid of the second dummy pattern 1132 may be formed to be disconnected from the metal mesh grids of the antenna pattern 1110a and the feed pattern 1120a. In this regard, the first dummy pattern 1131 may be formed in both directions, for example, in one side direction and in another side direction. On the other hand, unlike the first dummy pattern 1131, the second dummy pattern 1132 may be formed only in one direction, for example, in another side direction. The dummy pattern 1130a including the first dummy pattern 1131 and the second dummy pattern 1132 will be described in detail below.

Referring to FIG. 12B, the metal mesh grid may be printed uniformly over the entire layer to have the same optical transmittance. Accordingly, the transparency, namely, invisibility of the display antenna can be improved. Referring to FIGS. 12A and 12B, an antenna pattern may be implemented by disconnecting a portion of the metal mesh grid in consideration of an antenna path.

The dummy pattern 1130a may be disposed on the same plane as the antenna pattern 1110a. The dummy pattern 1130a may be disconnected from the antenna pattern 1110a to be implemented as a floating ground, so it may have a high resistance component. Although a coupling effect may occur between the antenna pattern 1110a and the dummy pattern 1130a, it may not significantly affect the antenna radiation characteristics. For example, even considering the coupling between the antenna pattern 1110a and the dummy pattern 1130a, the antenna radiation pattern and reflection coefficient characteristics may be exhibited at a similar level. For example, only about 0.1 dB of efficiency may be lowered due to the coupling between the antenna pattern 1110a and the dummy pattern 1130a.

When the metal mesh grid has a narrower line width, it may be more advantageous in terms of optical invisibility, but if the mesh grid pattern is too thin, it may increase the sheet resistance of the antenna pattern, causing a decrease in efficiency. In this regard, the optical transmittance ($T_{total}$) and sheet resistance ($R_{MM}$) of the transparent antenna are expressed by the following Equation 1 and Equation 2.

$$T_{Total} = \frac{(P-W)^2}{P^2} * T_{PET} \quad \text{[Equation 1]}$$

$$R'_{MM} = \frac{P}{W\sigma * t} \quad \text{[Equation 2]}$$

In this regard, referring to FIG. 12B and Equations 1 and 2, T denotes transmittance, TA denotes a transparent area (or region), P denotes a mesh pitch, and W denotes a mesh width. Also, $R_{MM}$ denotes sheet resistance, t denotes thickness, and σ denotes conductivity.

Meanwhile, the transparent antenna may form metal mesh patterns on both surfaces of a single dielectric corresponding to one of the PETs in FIG. 6. In this regard, a two-layer structure may be configured by forming a radiator on one surface of the PET and a ground on another surface, but a transparency issue may arise. To solve this issue, a metal mesh pattern may be formed on only one surface of a single dielectric and used as a radiator, but since there is no ground, the radiation patterns may be formed on both surfaces, which may cause a radiation performance issue.

To solve this issue, a structure may be configured in which an antenna pattern and a ground pattern, as illustrated in FIG. 6, are individually formed on the PETs 1032a and 1032b, respectively, and the PETs 1032a and 1032b are bonded to each other with the OCA 1031.

Referring to FIGS. 6 to 8 and 10A to 12B, the antenna module 1100 may include a flexible printed circuit board (FPCB) 1020, a first dielectric substrate 1032a, and a second dielectric substrate 1032b. The antenna module 1100 may further include an OCA layer 1031.

The FPCB 1020 may have a feed line formed on one surface thereof. The FPCB 1020 may have first ground patterns 1150 formed at both sides of the feed line 1120 to be spaced apart from the feed line 1120.

A first metal mesh pattern 1100a may be formed on the first dielectric substrate 1032a. Alternatively, the first dielectric substrate 1032a may be disposed on top of the first metal mesh pattern 1100a. The first dielectric substrate 1032a may be configured such that the first metal mesh pattern 1100a is connected to the feed pattern 1120 formed on the one surface of the FPCB 1020.

A second metal mesh pattern 1100b may be formed on the second dielectric substrate 1032b. Alternatively, the second dielectric substrate 1032b may be disposed on bottom of the second metal mesh pattern. The second dielectric substrate 1032b may be configured such that the second metal mesh pattern 1100b is connected to a second ground pattern 1150b formed on another surface of the FPCB 1020. In this regard, an alignment error between the first metal mesh pattern 1100a formed on the first dielectric substrate 1032a and the second metal mesh pattern 1100b formed on the second dielectric substrate 1032b may be smaller than that in a typical multi-layered structure.

The first metal mesh pattern 1100a may include an antenna pattern 1110a, a feed pattern 1120a, and a dummy pattern 1130a.

Referring to FIG. 6 and (a) of FIG. 7, the antenna module 1100 may be formed in an on-display structure. The second dielectric substrate 1032b of the antenna module 1100 may be disposed on the upper region of the display. Referring to FIGS. 6 to 8 and 10A to 12B, the antenna pattern 1110a may radiate a wireless signal toward the top of the first dielectric substrate 1032a.

Referring to FIG. 6 and (b) of FIG. 7, the antenna module 1100 may be formed in an under-display structure. The first dielectric substrate 1032a of the antenna module 1100 may be attached to the lower region of the display 151. The second dielectric substrate 1032b of the antenna module 1100 may be attached to the upper region of a lower structure. The antenna pattern 1110a may radiate a wireless signal through the display 151 located on the top of the first dielectric substrate 1032a.

Referring to FIG. 6 and (c) of FIG. 7, the antenna module 1100 may be formed in an in-display structure. The antenna module 1100 may be disposed between a first display 151-1 and a second display 151-2. The first dielectric substrate 1032a of the antenna module 1100 may be attached to the lower region of the first display 151-1. The second dielectric substrate 1032b of the antenna module 1100 may be attached to the upper region of the second display 151-2. Referring to FIGS. 6 to 10, the antenna pattern 1110a may radiate a wireless signal through the first display 151-1 located on the top of the first dielectric substrate 1032a.

Referring to FIGS. 6 to 8 and 10A to 12B, the antenna pattern 1110a may be configured such that metal mesh grids are interconnected in one axial direction and another axial direction. The feed pattern 1120a may be configured such that metal mesh grids are interconnected in one axial direction. In this regard, considering the line width of the feed line 1120, the metal mesh grids of the feed pattern 1120a may be formed only in one axial direction. As another example, the metal mesh grids of the feed pattern 1120a may be interconnected in one axial direction and another axial direction.

The dummy pattern 1130a may be configured such that metal mesh grids are disconnected in one axial direction and another axial direction. The dummy pattern 1130a may be disposed adjacent to the antenna pattern 1110a and the feed pattern 1120a to improve transparency and ground performance. To improve transparency and ground performance, the dummy pattern 1130a may be formed as a floating ground without being connected to the ground pattern 1150.

Hereinafter, the coupling structure between the display antenna and the FPCB will be described. In this regard, the antenna element 1110 may be disposed by a plurality of mesh grids formed by the first metal mesh pattern 1100a. The antenna element formed by the first metal mesh pattern 1100a may be disposed on the top, bottom, or inside of the display, as illustrated in (a) to (c) of FIG. 7. Meanwhile, the feed line 1120 formed with a predetermined width on the FPCB 1020 may be configured to be connected to the feed pattern 1120a that feeds the antenna element.

The display antenna may include a transparent antenna region 151a, an ACF bonding region 1021, and a signal line region 1022. The transparent antenna region may correspond to the display region. The ACF bonding region may correspond to a transition region 1021 and may be configured as a CPW line region. The signal line region 1022 may be configured as a microstrip line region.

Figure 13A:
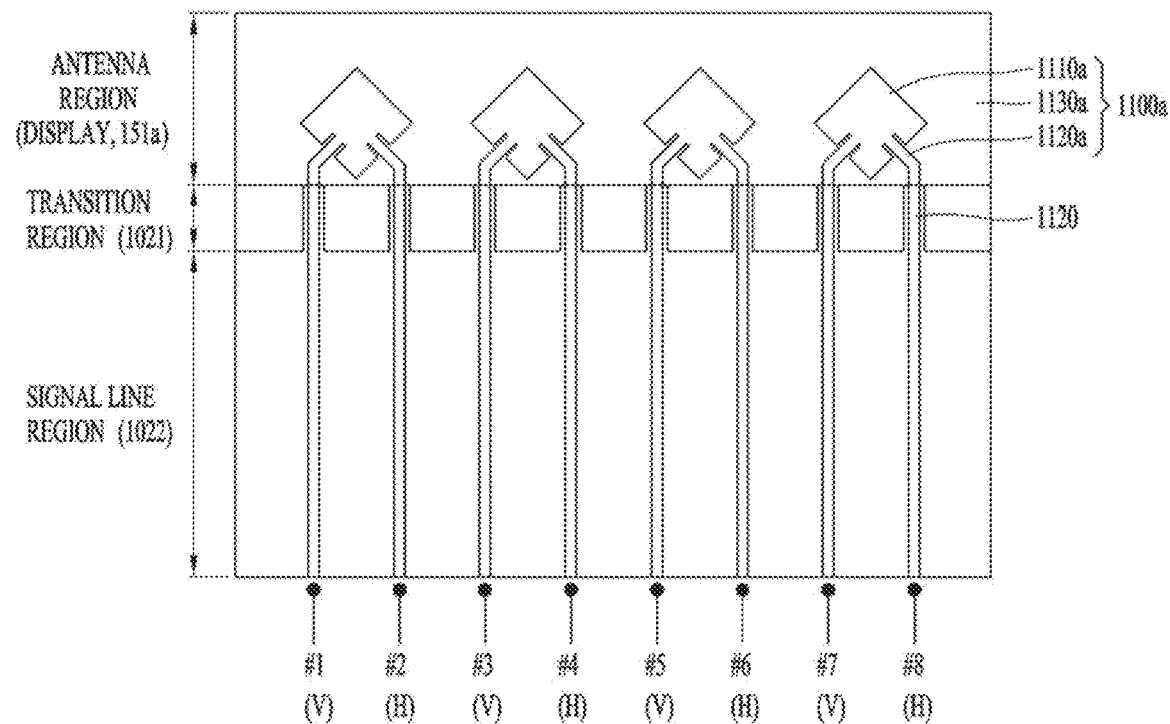
FIGS. 13A and 13B illustrate the configuration of an array antenna including a transparent antenna according to the present disclosure.
Figure 13B:
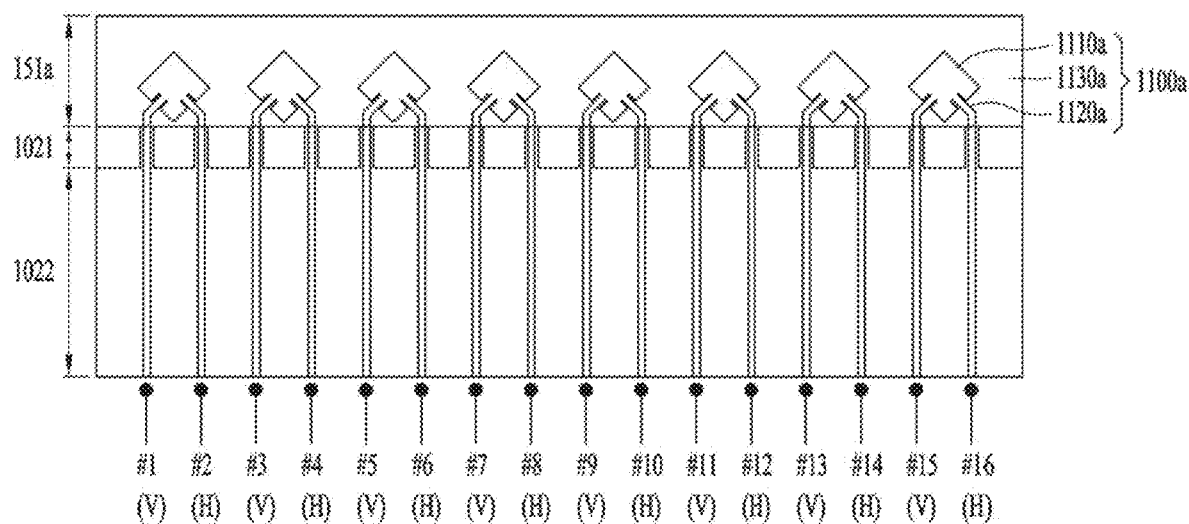

In this regard, FIGS. 13A and 13B illustrate the configuration of an array antenna including a transparent antenna according to the present disclosure. Specifically, FIG. 13A illustrates a 1×4 array antenna configuration in which four double-layered transparent antenna elements are disposed. FIG. 13B illustrates a 1×8 array antenna configuration in which eight double-layered transparent antenna elements are disposed.

Referring to FIG. 13A, the first metal mesh pattern 1100a that configures each patch antenna element may include an antenna pattern 1110a, a feed pattern 1120a, and a dummy pattern 1130. The patch antenna elements each including the antenna pattern 1110a, the feed pattern 1120a, and the dummy pattern 1130 may be arranged in the horizontal direction to form a 1×4 array antenna. Each patch antenna element may be connected to a feed pattern, through which feeding is made in one axial direction and another axial direction, thereby configuring a dual polarization antenna. The feed lines 1120 formed on the transition region 1021 and the signal line region 1022 may be configured to apply a first polarized signal and a second polarized signal to the antenna pattern 1110a. The feed lines 1120 may be alternately arranged so that a vertically polarized signal and a horizontally polarized signal are applied to the antenna pattern 1110a.

A spacing between the patch antenna elements may be set to about 3.0 mm, but is not limited thereto. A length from one end of the antenna region 151a to the end of the patch antenna element may be set to about 1.6 mm, but is not limited thereto. The length of the transition region 1021 may be set to about 1.0 mm, but is not limited thereto. The length of the signal line region 1022 may be set to about 10 mm, but is not limited thereto. The total length of the antenna module 1000 may be set to about 12.5 mm, but is not limited thereto.

Referring to FIG. 13B, the first metal mesh pattern 1100a that configures each patch antenna element may include an antenna pattern 1110a, a feed pattern 1120a, and a dummy pattern 1130. The patch antenna elements each including the antenna pattern 1110a, the feed pattern 1120a, and the dummy pattern 1130 may be arranged in the horizontal direction to form a 1×8 array antenna. Each patch antenna element may be connected to a feed pattern, through which feeding is made in one axial direction and another axial direction, thereby configuring a dual polarization antenna. The feed lines 1120 formed on the transition region 1021 and the signal line region 1022 may be configured to apply a first polarized signal and a second polarized signal to the antenna pattern 1110a. The feed lines 1120 may be alternately arranged so that a vertically polarized signal and a horizontally polarized signal are applied to the antenna pattern 1110a.

A spacing between the patch antenna elements may be set to about 3.0 mm, but is not limited thereto. A length from one end of the antenna region 151a to the end of the patch antenna element may be set to about 1.6 mm, equally to the configuration of FIG. 13A, but is not limited thereto. The length of the transition region 1021 may be set to about 1.0 mm, equally to the configuration of FIG. 13A, but is not limited thereto. The length of the signal line region 1022 may be set to about 10 mm, equally to the configuration of FIG. 13A, but is not limited thereto. The total length of the antenna module 1000 may be set to about 22.5 mm, but is not limited thereto.

Referring to FIGS. 13A and 13B, transparent electrodes printed on two thin films may serve as a radiator and a ground, respectively, and the following feed line transition process may be performed to supply signals to the antenna. For example, 1) signals may be applied to the transparent antenna through 1) RF connector (main PCB connection), 2) FPCB (microstrip signal line), 3) double-sided ACF bonding (MS-to-CPW transition), and 4) transparent antenna current application. Therefore, the double-layered transparent antenna structure disclosed therein can dramatically reduce the back-radiation of radio waves toward the inside of the display and greatly increase antenna radiation efficiency by using the characteristics of a patch antenna, which has a strong directivity toward the outside of the display. Meanwhile, the double-layered transparent antenna structures of the internal insertion type (in-display) and the external attachment types (on-/under-display) may all be configured to radiate and direct radio waves to the external region of the display.

Hereinafter, considering the above-mentioned technical features, the feed line structure of the double-layered transparent antenna structure disclosed herein will be described in detail. In this regard, referring to FIGS. 6 to 8 and 10A to 13B, the feed line 1120 may include a transition region 1021 and a signal line region 1022. In other words, the feed line 1120 may be disposed on the transition region 1021 and the signal line region 1022.

The transition region 1021 may be implemented as a CPW transmission line, which the first ground patterns 1150 are disposed on both sides of the feed line 1120, to perform impedance matching between the antenna element 1100 and the feed line 1120. The signal line region 1022 may be configured such that the feed line 1120 is arranged by a predetermined length in a first axial direction. The feed line 1120 disposed on the signal line region 1022 may be formed in a microstrip line shape on the FPCB 1031.

The dummy pattern 1130a may be disposed on the dielectric region of the first dielectric substrate 1032a. The first dielectric substrate 1032a may include a metal region and a dielectric region. The metal region may correspond to a region where the antenna pattern 1110a or the feed pattern 1120a is formed. The dielectric region may correspond to a region where a metal pattern such as the antenna pattern 1110a or the feed pattern 1120a is not disposed.

The dummy pattern 1130a may include a first dummy pattern 1131. The dummy pattern 1130a may further include a second dummy pattern 1132.

The first dummy pattern 1131 may be disposed on a dielectric region, and have metal mesh grids disposed in one axial direction and another axial direction to be disconnected from each other. The second dummy pattern 1132 may be disposed between the antenna pattern 1110a and the feed pattern 1120a. The second dummy pattern 1132 may be configured such that metal mesh grids are disposed in another axial direction to be disconnected from the antenna pattern 1110a and the feed pattern 1120a. In this regard, the second dummy pattern 1132 may be disposed between the antenna pattern 1110a and the feed pattern 1120a. The second dummy pattern 1132 may be disposed only in the another axial direction by considering a space between the antenna pattern 1110a and the feed pattern 1120a.

Figure 14:
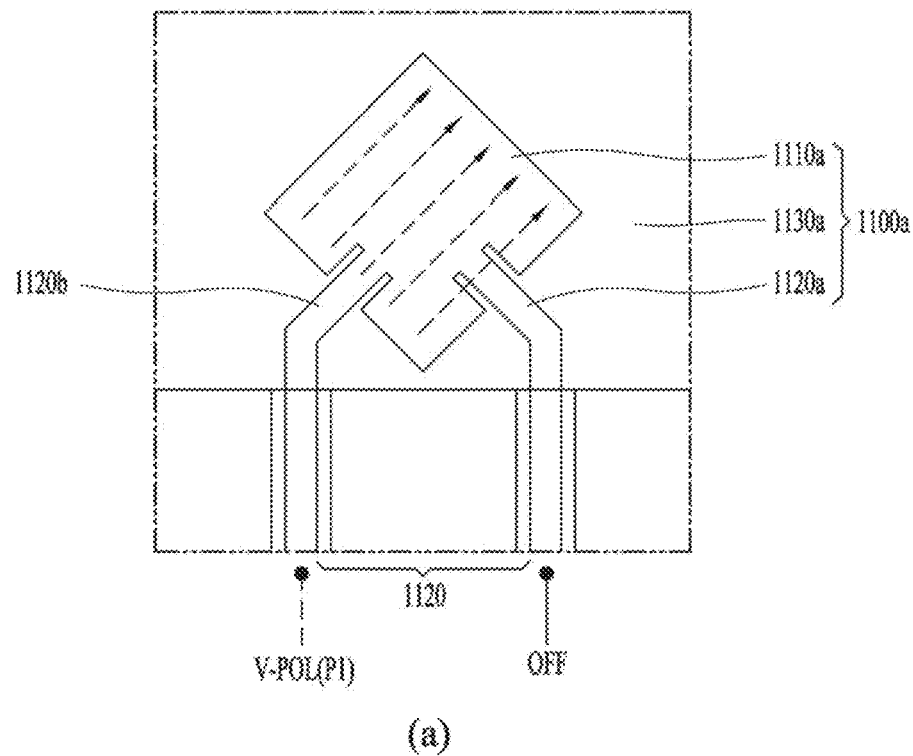
FIG. 14 illustrates current distribution in a dual polarization antenna according to a signal application method.
Figure 14:
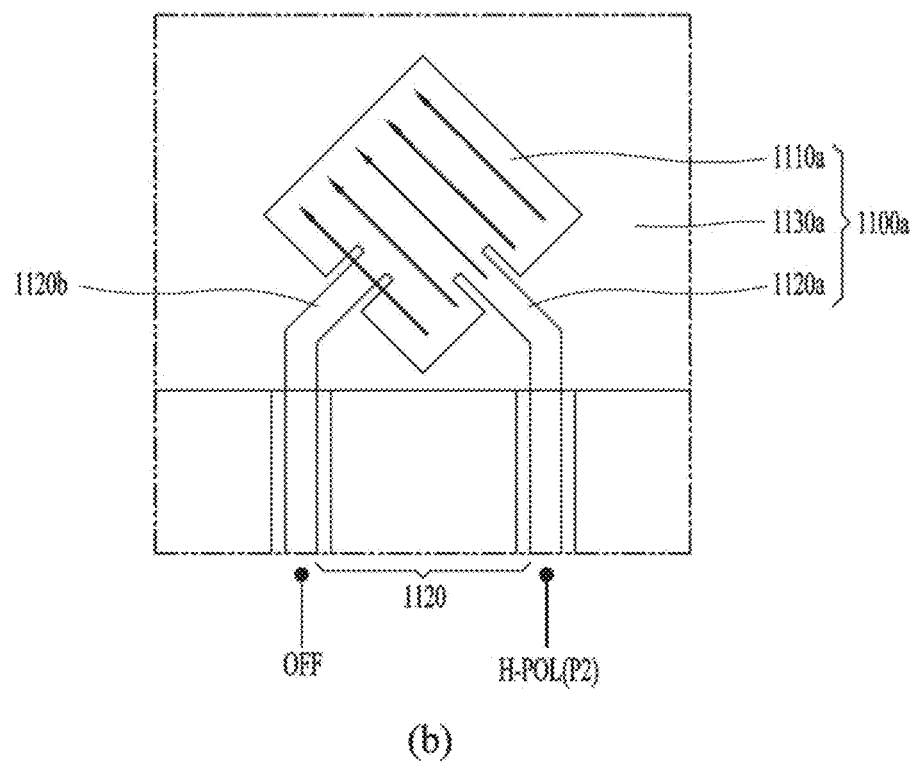

The transparent antenna disclosed herein may operate as a dual polarization antenna. In this regard, FIG. 14 illustrates current distribution in a dual polarization antenna according to a signal application method. Referring to (a) of FIG. 14, a first signal may be applied to the feed pattern 1120a formed in one axial direction to generate a first polarized signal in the antenna element. Referring to (b) of FIG. 14, a second signal may be applied to the second feed pattern 1120b formed in another axial direction to generate a second polarized signal in the antenna element.

In this regard, the antenna pattern 1110a may be connected to the feed pattern 1120a and the second feed pattern 1120b. The antenna pattern 1110a may operate as a dual polarization antenna with polarization in the one axial direction and polarization in the another axial direction by the feed pattern 1120a and the second feed pattern 1120b. Accordingly, the antenna element 1110 can operate as a dual polarization antenna having a first polarization and a second polarization by the antenna pattern 1110a connected to the feed pattern 1120a and the second feed pattern 1120b.

The feed pattern 1120a may be configured such that metal mesh grids are interconnected in one axial direction. The second feed pattern 1120b may be configured such that metal mesh grids are interconnected in another axial direction.

Figure 15:
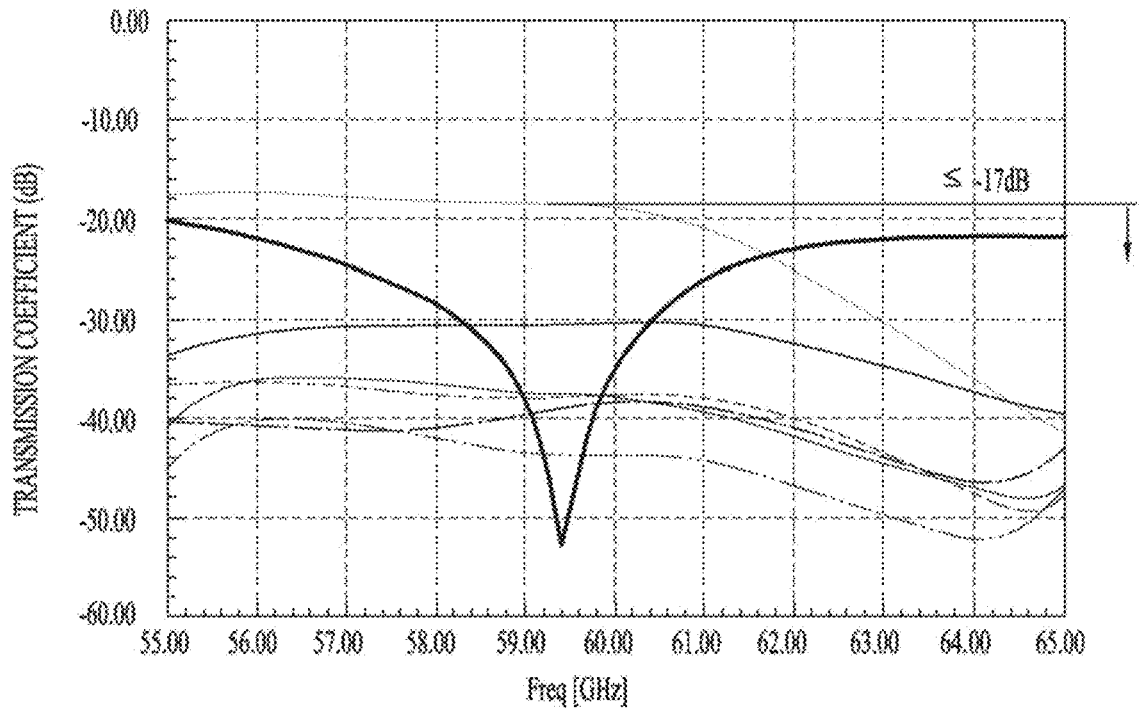
FIG. 15 illustrates an isolation between antenna elements constituting an array antenna.
Figure 15:
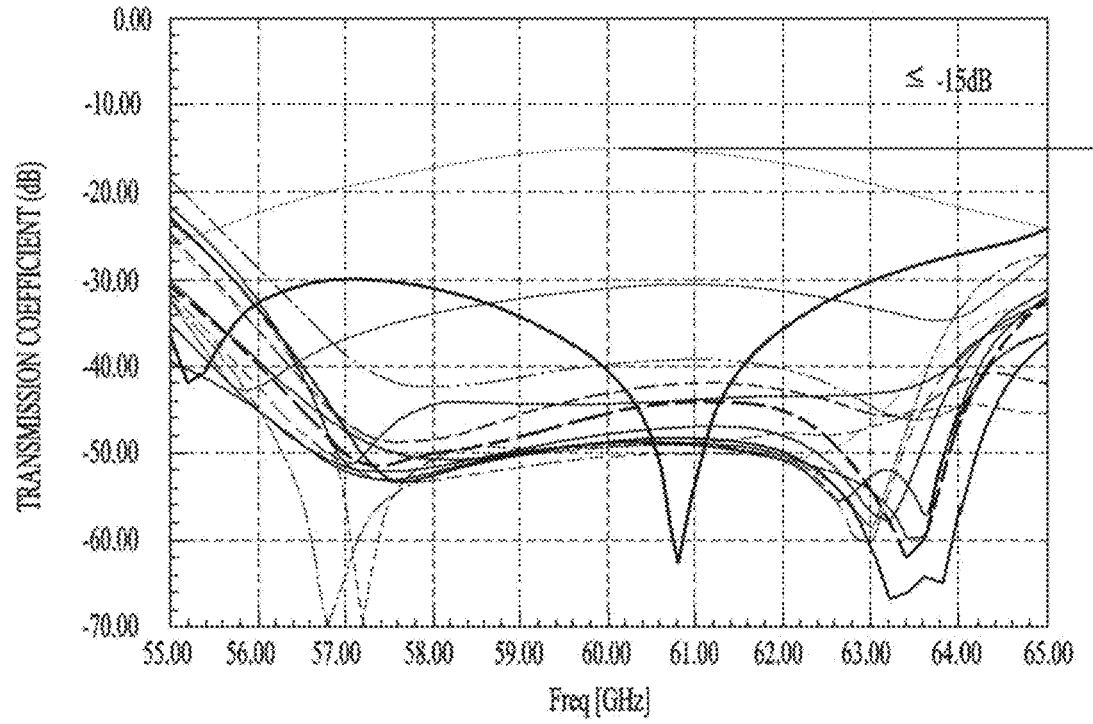

As described above, the double-layered transparent antenna structure disclosed herein may be configured as a dual polarization antenna and an array antenna. In this regard, FIG. 15 illustrates an isolation between antenna elements constituting an array antenna. (a) of FIG. 15 illustrates isolation between antenna elements constituting a 1×4 array antenna. (a) of FIG. 15 illustrates isolation between antenna elements constituting a 1×8 array antenna.

Referring to FIG. 13A and (a) of FIG. 15, the isolation between antenna ports, namely, first to eight ports, constituting a 1×4 array antenna in 55 to 65 GHz bands is shown. In this regard, the first, third, fifth, seventh ports may be ports through which a first polarized signal, for example, a vertical polarized signal, is applied. On the other hand, the second, fourth, sixth, and eighth ports may be ports through which a second polarized signal, for example, a horizontally polarized signal, is applied. Meanwhile, the isolation between the antenna ports, namely, between the first to eighth ports, constituting the 1×4 array antenna, may have a value of −17 dB or less in the entire band. Accordingly, the level of interference between antenna elements constituting the 1×4 array antenna may be almost ignored. Therefore, the level of interference between the antenna elements constituting the 1×4 array antenna can be lowered, thereby suppressing beam pattern distortion during beamforming. In addition, in the dual polarization antenna configuration, the level of interference between orthogonal polarizations can be lowered, thereby reducing interference between multiple input/multiple output (MIMO) streams.

Referring to FIG. 13B and (b) of FIG. 15, the isolation between antenna ports, namely, first to sixteenth ports, constituting a 1×8 array antenna in 55 to 65 GHz bands is shown. In this regard, the first, third, fifth, seventh, ninth, eleventh, thirteenth, and fifteenth ports may be ports through which a first polarized signal, for example, a vertical polarized signal, is applied. On the other hand, the second, fourth, sixth, eighth, tenth, twelfth, fourteenth, and sixteenth ports may be ports through which a second polarized signal, for example, a horizontally polarized signal, is applied. Meanwhile, the isolation between the antenna ports, namely, between the first to sixteenth ports, constituting the 1×8 array antenna, may have a value of −15 dB or less in the entire band. Accordingly, the level of interference between antenna elements constituting the 1×8 array antenna may be almost ignored. Therefore, the level of interference between the antenna elements constituting the 1×8 array antenna can be lowered, thereby suppressing beam pattern distortion during beamforming. In addition, in the dual polarization antenna configuration, the level of interference between orthogonal polarizations can be lowered, thereby reducing interference between multiple input/multiple output (MIMO) streams.

The double-layered transparent antenna disclosed herein may include an antenna pattern and a ground pattern. In this regard, referring to FIGS. 6 to 8, the double-layered transparent antenna structure according to the present disclosure may include a first metal mesh pattern 1100a and a second metal mesh pattern 1100b. As an example, the double-layered transparent antenna structure according to the present disclosure may include an antenna pattern 1110a corresponding to the first metal mesh pattern 1100a and a ground pattern corresponding to the second metal mesh pattern 1100b.

Figure 16A:
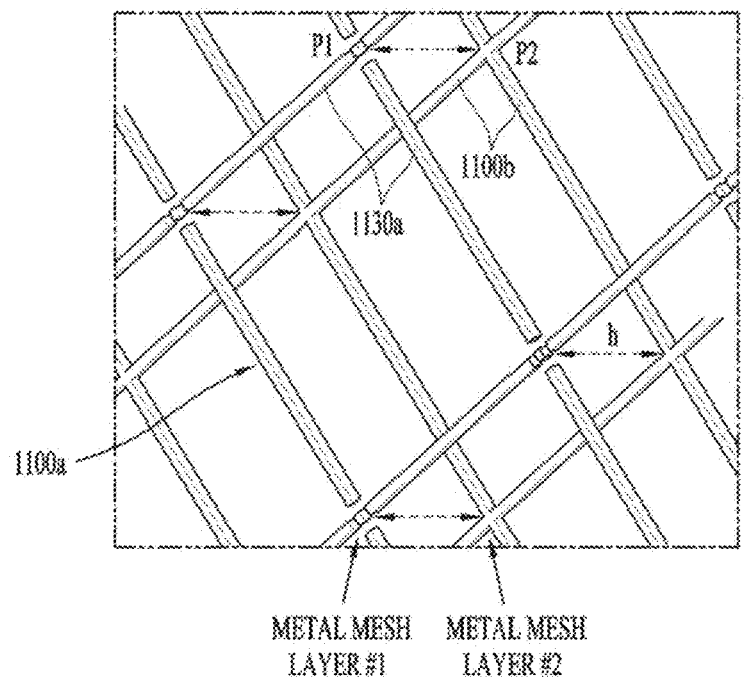
FIGS. 16A and 16B illustrate the structures of first and second metal mesh patterns according to the present disclosure.
Figure 16B:
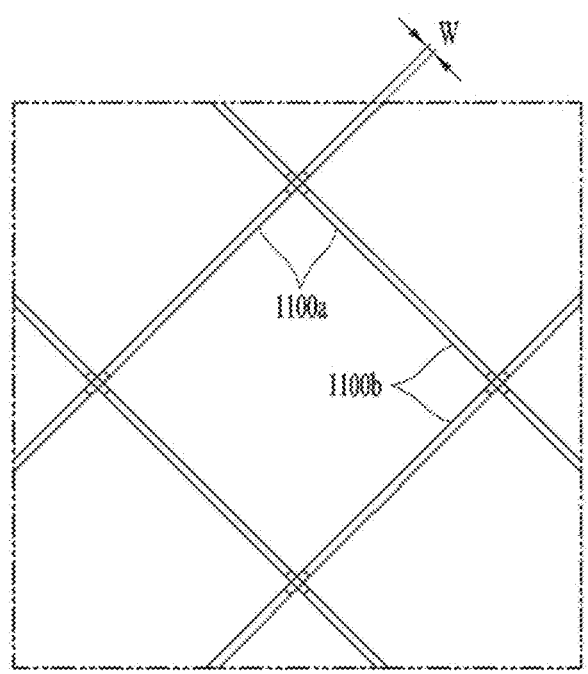

In this regard, FIGS. 16A and 16B illustrate the structures of first and second metal mesh patterns according to the present disclosure. Specifically, FIG. 16A illustrates a structure in which the first and second metal mesh patterns according to the present disclosure are spaced apart by a predetermined spacing in a thickness direction. FIG. 16B is a front view illustrating the structure of the first and second metal mesh patterns according to the present disclosure.

Referring to FIGS. 6 to 8 and 10A to 16B, the second metal mesh pattern 1100b may be configured such that metal mesh grids are interconnected in one axial direction and another axial direction to form a ground pattern. A patch antenna that radiates a wireless signal toward the top of the first dielectric substrate 1031a may be configured by the antenna pattern 1110a of the first metal mesh pattern 1100a and the ground pattern corresponding to the second metal mesh pattern 1100b.

The shape of the first metal mesh pattern 1100a may be formed to correspond to the shape of the second metal mesh pattern 1100*b*. The thickness of the first metal mesh pattern 1100*a* in a height direction may be formed to correspond to the thickness of the second metal mesh pattern 1100*b* in the height direction. The line width of the first metal mesh pattern 1100*a* may be formed to correspond to the line width of the second metal mesh pattern 1100*b*. Accordingly, the shape, the thickness in the height direction, and the line width of the first metal mesh pattern 1100*a* may be formed to correspond to the shape, the thickness in the height direction, and the line width of the second metal mesh pattern 1100*b*. At least one of the shape, the thickness in the height direction, and the line width of the first metal mesh pattern 1100*a* may be formed to correspond to at least one of the shape, the thickness in the height direction, and the line width of the second metal mesh pattern 1100*b*.

To improve the optical invisibility of the transparent antenna, the shape, thickness, and line width of the metal mesh cells on the top and bottom surfaces may be the same. Additionally, two layers of grids may be configured to be aligned. Accordingly, when viewed from the front of the display, the metal mesh cells on the top and bottom surfaces may appear to overlap each other, improving optical transmittance. In this regard, a distance h between the metal mesh cells on the top and bottom surfaces may be made equal to the thickness of the OCA corresponding to the optical adhesive. Depending on the distance h between the metal mesh cells, electrical performance (bandwidth) and optical performance (moire, color shift) of the transparent antenna may be adjusted. Accordingly, the distance h between the metal mesh cells can be optimized to be suitable for a display environment.

Grid intersection points of the first metal mesh pattern 1100*a* and the second metal mesh pattern 1100*b* may be formed to correspond to each other. The first point P1 where the grids of the first metal mesh pattern 1100*a* intersect in one axial direction and another axial direction may be formed to correspond to the second point P2 where the grids of the second metal mesh pattern 1100*b* intersect in the one axial direction and the another axial direction. Therefore, when viewed from the front of the display, the mesh grids on the top surface and the mesh grids on the bottom surface may appear to overlap each other, so transparency can be maintained even when the transparent antenna is implemented in the display.

As described above, the antenna module 1100 may include the flexible circuit board (FPCB) 1031, the first dielectric substrate 1032*a*, and the second dielectric substrate 1032*b*. The antenna module 1100 may further include the OCA layer 1031. The OCA layer 1031 may be configured to bond the first dielectric substrate 1032*a* and the second dielectric substrate 1032*b*. The OCA layer 1031 may be formed on the same layer as the FPCB 1020.

Figure 17:
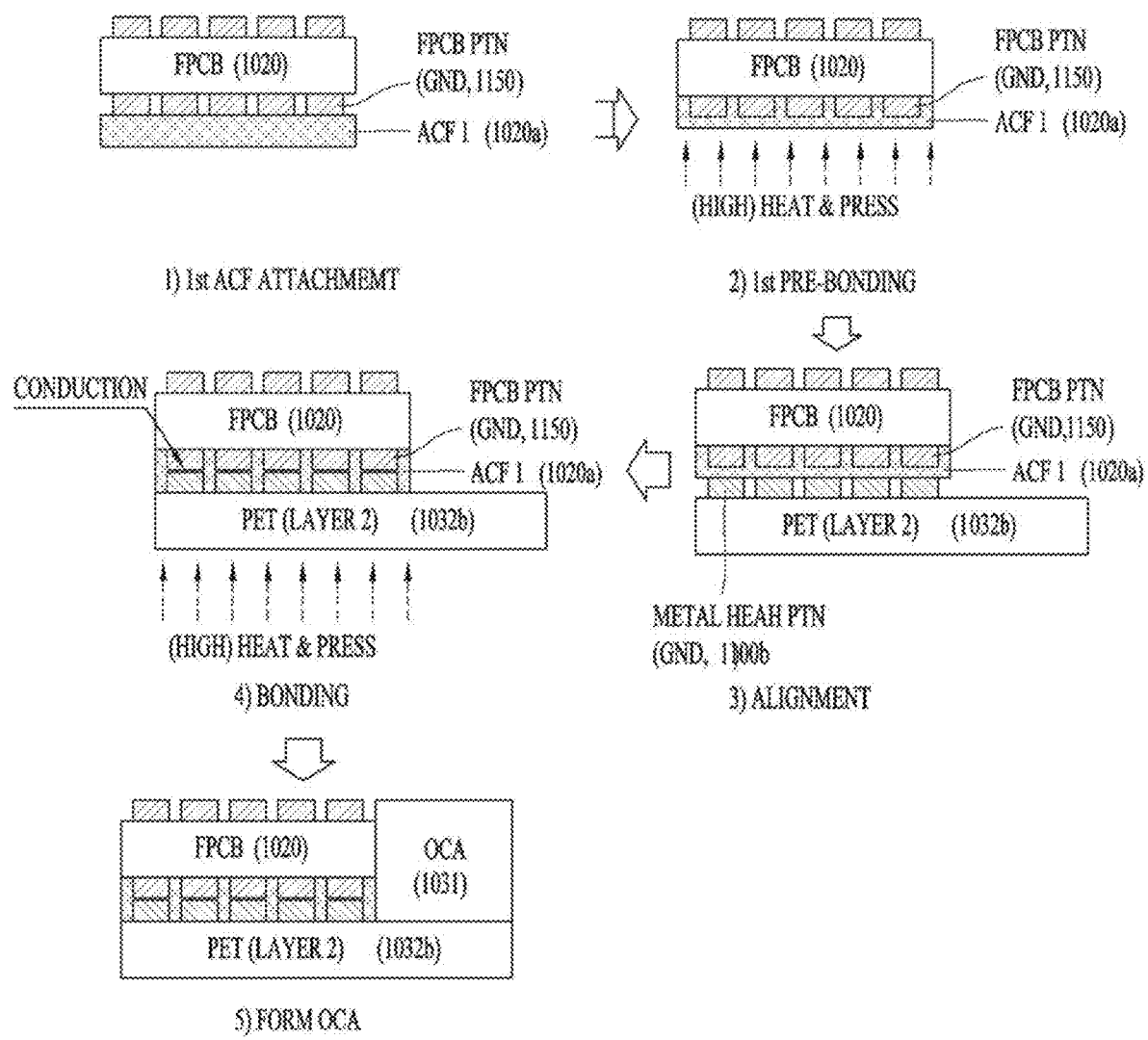
FIGS. 17 and 18 illustrate a plurality of manufacturing processes for a double-layered transparent antenna disclosed herein.
Figure 18:
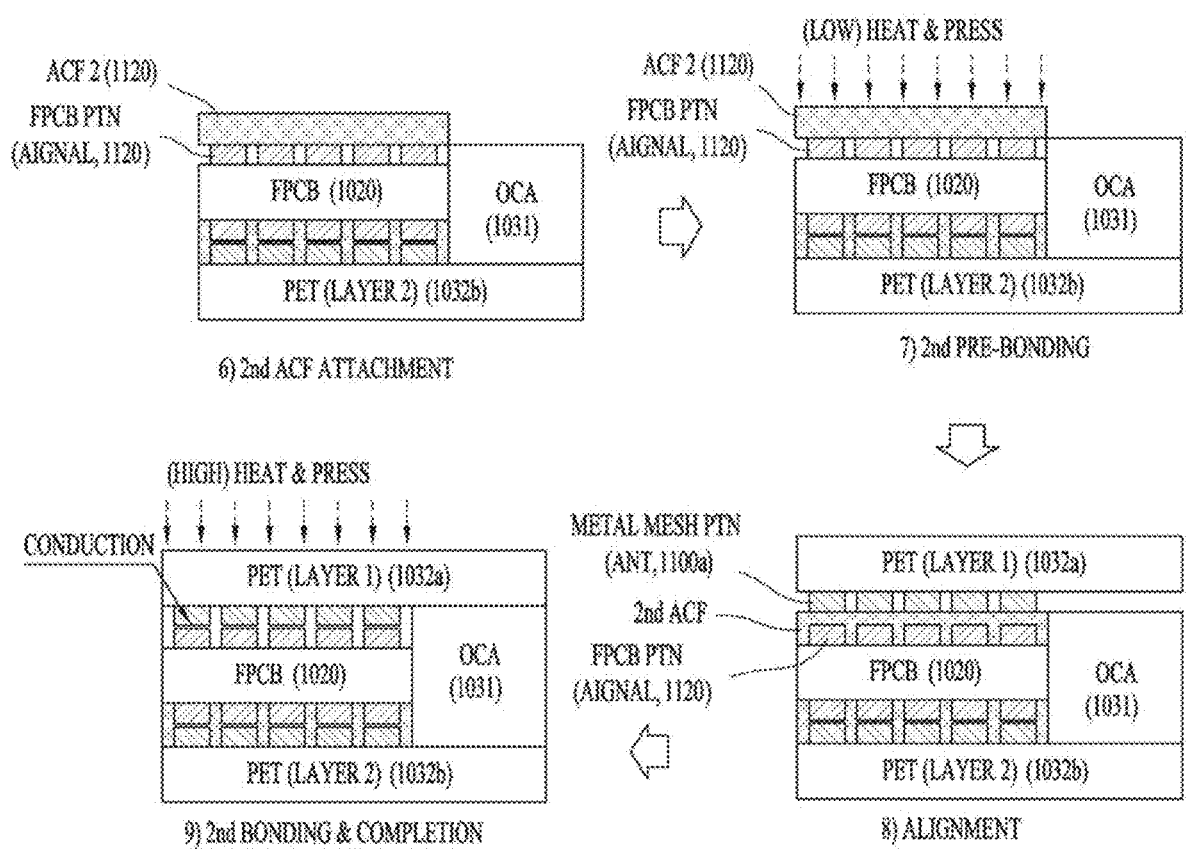

The double-layered transparent antenna disclosed herein may be manufactured through a plurality of manufacturing processes. In this regard, FIGS. 17 and 18 illustrate a plurality of manufacturing processes for the double-layered transparent antenna disclosed herein.

Referring to FIGS. 6 to 8 and 10A to 17, the FPCB 1020 may be pre-bonded to the ACF layer 1020*a* by a heat-based pressing operation. The second metal mesh pattern 1100*b* formed on the second dielectric substrate 1032*b* may be aligned with the ground pattern 1150 on another surface of the FPCB 1020. In the aligned state, the FPCB 1020 may be bonded to the second dielectric substrate 1032*b*. Therefore, the OCA layer 1031 may be formed in a region adjacent to the FPCB 1020 on the same layer as the FPCB 1020 to correspond to the top end of the FPCB 1020.

Specifically, 1) the ground pattern 1150 of the FPCB 1020 may be attached to the ACF layer 1020*a* through an ACF attachment process. 2) A first pre-bonding process may be performed in the state where the ground pattern 1150 of the FPCB 1020 is attached to the ACF layer 1020*a*. In the first pre-bonding process, the ground pattern 1150 and the ACF layer 1020*a* may be bonded to each other through a low-temperature & press operation. The temperature of the first pre-bonding process may be about 60 to 90 degrees and the time thereof may be about 3 to 5 seconds, but are not limited thereto. 3) Through an alignment process, the alignment between the ground pattern 1150 of the FPCB 1020 and the second metal mesh pattern 1100*b* of the second dielectric substrate 1032*b* may be performed.

4) Through a first bonding process, the bonding between the ground pattern 1150 of the FPCB 1020 and the second metal mesh pattern 1100*b* of the second dielectric region 1032*b* may be performed. Accordingly, conduction may occur in the aligned state between the ground pattern 1150 and the second metal mesh pattern 1100*b*. In the first bonding process, the ground pattern 1150 and the second metal mesh pattern 1100*b* may be bonded through a high-temperature & press operation. The temperature of the first bonding process may be about 160 to 210 degrees and the time thereof may be about 5 to 20 seconds, but are not limited thereto. 5) Through an OCA formation process, the OCA layer 1031 may be formed adjacent to the FPCB 1020 on the same plane.

Referring to FIGS. 6 to 8 and 10A to 18, a second ACF layer 1020*b* may be attached to the top of the feed line 1120, which is formed on one surface of the FPCB 1020. The FPCB 1020 may be pre-bonded to the second ACF layer 1020*b* by a heat-based pressing operation. Additionally, the first metal mesh pattern 1100*a* formed on the first dielectric substrate 1032*a* may be aligned with the feed line 1120 on one surface of the FPCB 1020. In the aligned state, the FPCB 1020 may be bonded to the first dielectric substrate 1032*a*.

Specifically, 6) the feed line 1120 of the FPCB 1020 may be attached to the second ACF layer 1020*b* through a second ACF attachment process. 7) A second pre-bonding process may be performed in the state where the feed line 1120 of the FPCB 1020 is attached to the second ACF layer 1020*b*. In the second pre-bonding process, the feed line 1120 and the ACF layer 1020*a* may be bonded to each other through a low-temperature & press operation. The temperature of the second pre-bonding process may be about 60 to 90 degrees and the time thereof may be about 3 to 5 seconds, but are not limited thereto. 8) Through an alignment process, the alignment between the ground pattern 1120 of the FPCB 1020 and the first metal mesh pattern 1100*a* of the first dielectric substrate 1032*a* may be performed.

9) Through a bonding process, the alignment between the feed line 1120 of the FPCB 1020 and the first metal mesh pattern 1100*a* of the first dielectric substrate 1032*a* may be performed. Accordingly, conduction may occur in the aligned state between the feed line 1120 and the first metal mesh pattern 1100*a*. In the second bonding process, the feed line 1120 and the first metal mesh pattern 1100*a* may be bonded through a high-temperature & press operation. The temperature of the second bonding process may be about 160 to 210 degrees and the time thereof may be about 5 to 20 seconds, but are not limited thereto. 5) Through an OCA formation process, the OCA layer 1031 may be formed adjacent to the FPCB 1020 on the same plane.

The foregoing description has been given of the double-layered transparent antenna structure according to the present disclosure. In this regard, frequency band expansion and communication module design technologies for supporting ultra-high speed and large capacity communications are rapidly evolved together with rapid development of 5G mobile communication. In relation to this, an application of such technologies to various industrial groups such as TV, robot, vehicle, terminal, etc. is taken into account. In addition, the demand for development of a thinner and lighter full-screen display to which design factors are reflected is greatly increasing.

The present disclosure proposes an idea related to designing a transparent display antenna capable of being applied to a full-screen display. Therefore, the present disclosure proposes a transparent antenna design and a signal line connection method capable of reinforcing radio wave directivity toward the front surface of a display without spoiling a product design.

When connecting a signal line for connection to a main board, an optical adhesive (OCA, etc.) that has the same thickness as a signal line board (FPCB) may be used, and transparent antennas printed on two sheets of thin films (PET, COP, etc.) may be attached to both surfaces of the adhesive and ends of the transparent antennas may be connected in contact with the ends of the feed line of the signal line substrate (FPCB). At this time, the top and bottom surfaces where the feed line and the transparent antennas come into contact may be bonded and electrically connected through ACF bonding.

Depending on a method of applying a transparent antenna to a display, internal insertion (in-Display) and external attachment (on-/under-display) may be employed. Meanwhile, the transparent antenna proposed herein may be configured to maintain directivity toward the outside of the display. Meanwhile, transparent electrodes printed on two sheets of thin films serve as a radiator and a ground plane, respectively. Meanwhile, a transparent antenna in the form of a transparent electrode may be designed to operate as a patch antenna by being coupled to a microstrip line or CPW type feed line. At this time, the transparent electrode may use a metal mesh conductor etching method.

Figure 19:
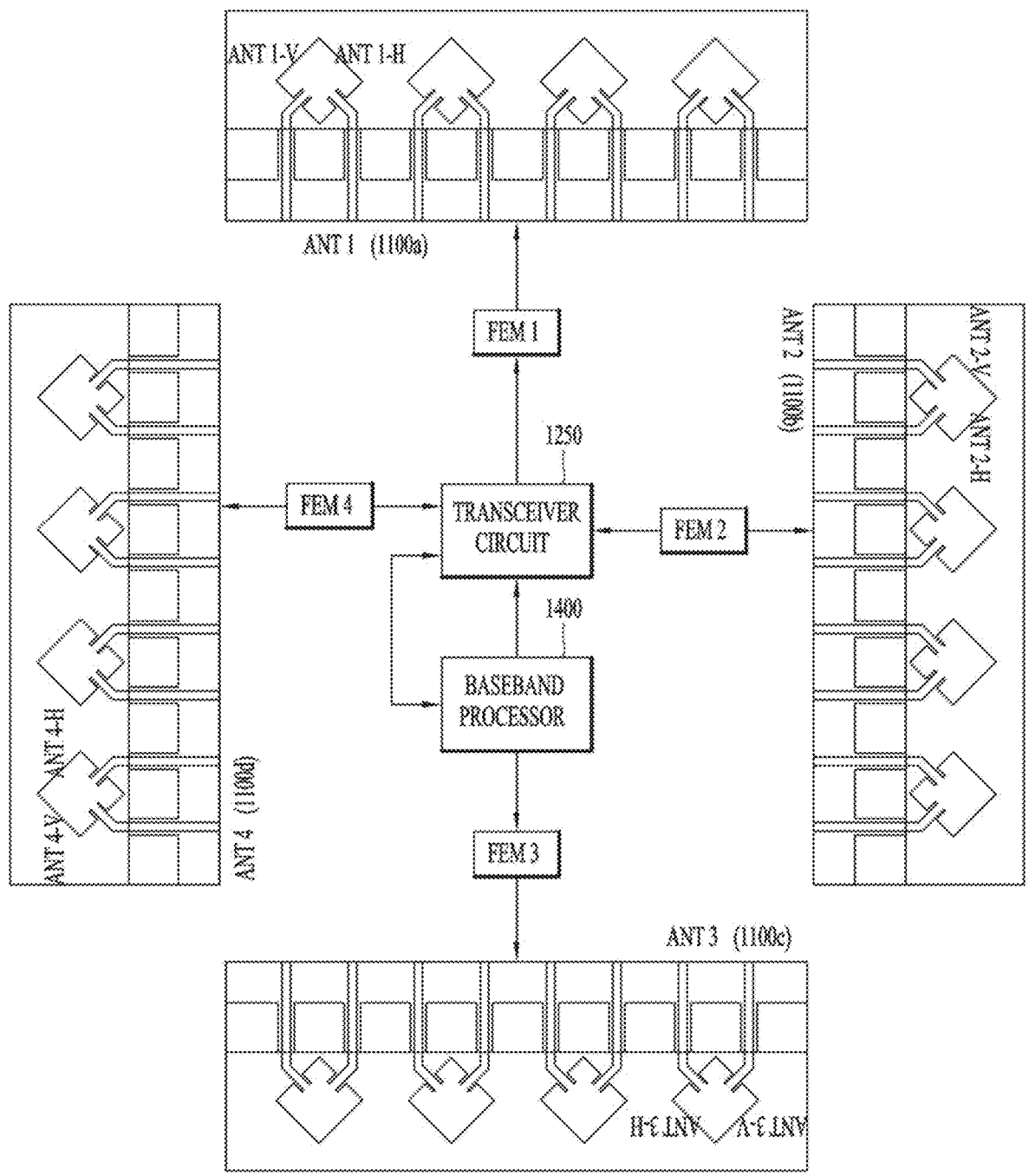
FIG. 19 illustrates an antenna module configured in a dual polarization antenna structure according to one embodiment, and an electronic device including the antenna module.

The dual polarization array antenna structure according to the present disclosure may be configured by a plurality of array antennas disposed at different positions of the electronic device. In this regard, FIG. 19 illustrates an antenna module configured in a dual polarization antenna structure according to one embodiment, and an electronic device including the antenna module.

Referring to FIGS. 1 to 19, the electronic device may include a display 151 and an antenna module 1100. The display 151 may be configured to display information on a screen. The display 151 may have a metal mesh pattern to radiate wireless signals to an electronic device placed nearby. The antenna module 1100 may be disposed on the lower region of the electronic device. In this regard, the location where the antenna module 1100 is disposed is not limited to this and may change in various ways depending on applications.

The antenna module 1100 may include a flexible printed circuit board (FPCB) 1020, a first dielectric substrate 1032a, and a second dielectric substrate 1032b. The antenna module 1100 may further include an OCA layer 1031.

The FPCB 1020 may have a feed line 1120 disposed on one surface. The FPCB 1020 may have first ground patterns 1150 formed on both sides of the feed line 1120 to be spaced apart from the feed line 1120.

A first metal mesh pattern 1100a may be formed on the first dielectric substrate 1032a. Alternatively, the first dielectric substrate 1032a may be disposed on top of the first metal mesh pattern 1100a. The first dielectric substrate 1032a may be configured such that the first metal mesh pattern 1100a is connected to the feed pattern 1120 formed on one surface of the FPCB 1020.

A second metal mesh pattern 1100b may be formed on the second dielectric substrate 1032b. Alternatively, the second dielectric substrate 1032b may be disposed on bottom of the second metal mesh pattern. The second dielectric substrate 1032b may be configured such that the second metal mesh pattern 1100b is connected to the second ground pattern 1150b formed on another surface of the FPCB 1020. In this regard, an alignment error between the first metal mesh pattern 1100a formed on the first dielectric substrate 1032a and the second metal mesh pattern 1100b formed on the second dielectric substrate 1032b may be smaller than that in a typical multi-layered structure.

The first metal mesh pattern 1100a may include an antenna pattern 1110a, a feed pattern 1120a, and a dummy pattern 1130a.

The antenna pattern 1110a may be configured such that metal mesh grids are interconnected in one axial direction and another axial direction. The feed pattern 1120a may be configured such that metal mesh grids are interconnected in one axial direction. In this regard, considering the line width of the feed line 1120, the metal mesh grids of the feed pattern 1120a may be formed only in one axial direction. As another example, the metal mesh grids of the feed pattern 1120a may be interconnected in one axial direction and the another axial direction.

The dummy pattern 1130a may be configured such that metal mesh grids are disconnected in one axial direction and another axial direction. The dummy pattern 1130a may be disposed adjacent to the antenna pattern 1110a and the feed pattern 1120a to improve transparency and ground performance. To improve transparency and ground performance, the dummy pattern 1130a may be formed as a floating ground without being connected to the ground pattern 1150.

The dummy pattern 1130a may be disposed in the dielectric region of the first dielectric substrate 1032a. The first dielectric substrate 1032a may include a metal region and a dielectric region. The metal region may correspond to a region where the antenna pattern 1110a or the feed pattern 1120a is formed. The dielectric region may correspond to a region where a metal pattern such as the antenna pattern 1110a or the feed pattern 1120a is not disposed.

The dummy pattern 1130a may include a first dummy pattern 1131. The dummy pattern 1130a may further include a second dummy pattern 1132.

The first dummy pattern 1131 may be disposed in the dielectric region, and have metal mesh grids disposed to be disconnected in one axial direction and another axial direction. The second dummy pattern 1132 may be disposed between the antenna pattern 1110a and the feed pattern 1120a. The second dummy pattern 1132 may be configured such that metal mesh grids are arranged in another axial direction to be disconnected from the antenna pattern 1110a and the feed pattern 1120a. In this regard, the second dummy pattern 1132 may be disposed between the antenna pattern 1110a and the feed pattern 1120a. The second dummy pattern 1132 may be disposed only in the another axial direction by considering a space between the antenna pattern 1110a and the feed pattern 1120a.

The transparent antenna disclosed herein may operate as a dual polarization antenna. In this regard, the antenna pattern 1110a may be connected to the feed pattern 1120a and the second feed pattern 1120b. The antenna pattern 1110a may operate as a dual polarization antenna with polarization in the one axial direction and polarization in another axial direction by the feed pattern 1120a and the second feed pattern 1120b. Accordingly, the antenna element 1110 can operate as a dual polarization antenna having a first polarization and a second polarization by the antenna pattern 1110a connected to the feed pattern 1120a and the second feed pattern 1120b.

The feed pattern 1120a may be configured such that metal mesh grids are interconnected in one axial direction. The second feed pattern 1120b may be configured such that metal mesh grids are interconnected in another axial direction.

Meanwhile, the second metal mesh pattern 1100b may be configured such that metal mesh grids are interconnected in one axial direction and another axial direction to form a ground pattern. A patch antenna that radiates a wireless signal toward the top of the first dielectric substrate 1031a may be configured by the antenna pattern 1110a of the first metal mesh pattern 1100a and the ground pattern corresponding to the second metal mesh pattern 1100b. Accordingly, the patch antenna can radiate a wireless signal toward the front of the electronic device by the antenna pattern 1110a of the first metal mesh pattern 1100a and the ground pattern corresponding to the second metal mesh pattern 1100b.

Meanwhile, the antenna module 1100 that is implemented as an array antenna in the present disclosure may include a plurality of antenna modules 1100a to 1100d disposed on different regions of the electronic device. In this regard, the electronic device may further include the transceiver circuit 1250 and the processor 1400. In this regard, the transceiver circuit 1250 and the processor 1400 may be disposed on a separate circuit board from the display with the antenna module (ANT) 1100 and the FPCB.

The transceiver circuit 1250 may be electrically connected to the antenna module 1100. The transceiver circuit 1250 may be configured to apply a first signal and a second signal to the antenna pattern 1110a through the feed pattern 1120a and the second feed pattern 1120b.

The processor 1400 may be operably coupled to the transceiver circuit 1250 and may be configured to control the transceiver circuit 1250. The processor 1400 may control the transceiver circuit 1250 to perform MIMO while performing beamforming in different directions through the plurality of antenna modules 1100a to 1100d.

The processor 1400 may control the transceiver circuit 1250 to perform beamforming while performing multiple input/multiple output (MIMO) as a first signal and a second signal are applied to the plurality of array antennas disposed in a plurality of antenna elements. In this regard, the first signal and the second signal for MIMO may be a first polarized signal and a second polarized signal in an orthogonal state. Meanwhile, the processor may control the transceiver circuit 1250 to perform first beamforming by the first signal and second beamforming by the second signal.

The first antenna module ANT1 to the fourth antenna module ANT4 may be operably coupled to a first front end module FEM1 to a fourth front end module FEM4. In this regard, each of the first front end module FEM1 to the fourth front end module FEM4 may include a phase controller, a power amplifier, and a reception amplifier. Each of the first front end module FEM1 to the fourth front end module FEM4 may include several components of the transceiver circuit 1250.

The processor 1400 may be operably coupled to the first front end module FEM1 to the fourth front end module FEM4. The processor 1400 may include several components of the transceiver circuit 1250 corresponding to the RFIC. The processor 1400 may include a baseband processor 1400 corresponding to a modem. The processor 1400 may be provided in a system on chip (SoC) form to include several components of the transceiver circuit 1250 corresponding to the RFIC and the baseband processor 1400 corresponding to the modem. However, the configuration of FIG. 12 is not limited thereto but may vary differently depending on applications.

The processor 1400 may control the first front end module FEM1 to the fourth front end module FEM4 to radiate signals through at least one of the first antenna module ANT1 to the fourth antenna module ANT4. In this regard, an optimal antenna may be selected based on quality of a signal received through each of the first antenna module ANT1 to the fourth antenna module ANT4.

The processor 1400 may control the first front end module FEM1 to the fourth front end module FEM4 to perform MIMO through two or more of the first antenna module ANT1 to the fourth antenna module ANT4. In this regard, an optimal antenna combination may be selected based on quality and interference level of a signal received through each of the first array antenna ANT1 to the fourth array antenna ANT4.

The processor 1400 may control the first front end module FEM1 to the fourth front end module FEM4 to perform carrier aggregation (CA) through at least one of the first antenna module ANT1 to the fourth antenna module ANT4. In this regard, when each of the first array antenna ANT1 to the fourth array antenna ANT4 dual-resonates at the first band and the second band, the CA may be performed through one array antenna.

The processor 1400 may determine signal qualities at the first band and the second band with respect to each of the antennas. The processor 1400 may perform CA through one antenna at the first band and another antenna at the second band on the basis of signal qualities at the first band and the second band.

The antenna module corresponding to the multi-layered substrate may include various numbers of array antennas. In this regard, the electronic device may include two or more array antennas. The electronic device may include two array antennas and perform beamforming and MIMO using the two array antennas. As another example, the electronic device may include four or more array antennas and perform beamforming and MIMO using some of the four or more array antennas.

The antenna module may include the first array antenna 1100-1 and the second array antenna 1100-2. In this regard, the first array antenna 1100-1 and the second array antenna 1100-2 may operate as different polarized antennas.

The first array antenna (1100a) ANT1 may include a first horizontally polarized antenna ANT1-H and a first vertically polarized antenna ANT1-V. The second array antenna (1100b) ANT2 may include a second horizontally polarized antenna ANT2-H and a second vertically polarized antenna ANT2-V. On the other hand, the third array antenna (1100c) ANT3 may include a third horizontally polarized antenna ANT3-H and a third vertically polarized antenna ANT3-V. The fourth array antenna (1100d) ANT4 may include a fourth horizontally polarized antenna ANT4-H and a fourth vertically polarized antenna ANT4-V.

In this regard, the first to fourth horizontally polarized antennas ANT1-H to ANT4-H may be first type array antennas operating as the horizontally polarized antennas, like the dipole antenna 1100. In this regard, the first to fourth vertically polarized antennas ANT1-V to ANT4-V may be second type array antennas operating as the vertically polarized antennas, like the slot antenna 1100b.

One antenna module may include therein different antennas having polarizations orthogonal to each other, so as to increase the number of MIMO streams by two times. The electronic device may perform maximum rank 8 MIMO through the first horizontally polarized antenna ANT1-H to the fourth horizontally polarized antenna ANT4-H and the first vertically polarized antenna ANT1-V to the fourth vertically polarized antenna ANT4-V. The electronic device may perform 8Tx UL-MIMO through the first horizontally polarized antenna ANT1-H to the fourth horizontally polarized antenna ANT4-H and the first vertically polarized antenna ANT1-V to the fourth vertically polarized antenna ANT4-V. The electronic device may perform 8Rx DL-MIMO through the first horizontally polarized antenna ANT1-H to the fourth horizontally polarized antenna ANT4-H and the first vertically polarized antenna ANT1-V to the fourth vertically polarized antenna ANT4-V.

Alternatively, one antenna module may include therein different antennas having polarizations orthogonal to each other, to suppress signal quality from being lowered due to rotation of the electronic device. In this regard, the first antenna ANT1 may simultaneously transmit and/or receive signals through the first horizontally polarized antenna ANT1-H and the first vertically polarized antenna ANT1-V. Accordingly, even if signal quality received through any one antenna is lowered due to the rotation of the electronic device, signal reception can be carried out through another antenna. Similarly, the fourth antenna ANT4 may simultaneously transmit and/or receive signals through the fourth horizontally polarized antenna ANT4-H and the fourth vertically polarized antenna ANT4-V. Accordingly, even if signal quality received through any one antenna is lowered due to the rotation of the electronic device, signal reception can be carried out through another antenna.

The processor 1400 may maintain dual connectivity state or perform a MIMO operation with different entities through the horizontally polarized antenna and the vertically polarized antenna. In this regard, the processor 1400 may control the transceiver circuit 1250 to maintain the dual connectivity state with a first entity and a second entity through the first array antenna (1100a) ANT1 and the fourth array antenna (1100d) ANT4. In this case, the first array antenna (1100a) ANT1 and the fourth array antenna (1100d) ANT4 may operate as the horizontally polarized antenna and the vertical polarized antenna, respectively. Therefore, the processor 1400 may perform dual connectivity or MIMO through antennas that are disposed at different positions in the antenna module of the electronic device to operate as polarized antennas orthogonal to each other. This can reduce interference between signals transmitted or received through different antennas during dual connectivity or MIMO.

As another example, the processor 1400 may control the transceiver circuit 1250 to maintain the dual connectivity state with a first entity and a second entity through the first array antenna (1100b) ANT2 and the fourth array antenna (1100c) ANT3, respectively. In this case, the second array antenna (1100b) ANT2 and the third array antenna (1100c) ANT3 may operate as the vertically polarized antenna and the horizontally polarized antenna, respectively. Therefore, the processor 1400 may perform dual connectivity or MIMO through antennas that are disposed at different positions in the antenna module of the electronic device to operate as polarized antennas orthogonal to each other. This can reduce interference between signals transmitted or received through different antennas during dual connectivity or MIMO.

It will be clearly understood by those skilled in the art that various changes and modifications to the aforementioned embodiments related to the array antenna operating at the mmWave band and the electronic device controlling the same are made without departing from the idea and scope of the present disclosure. Therefore, it should be understood that such various modifications and alternations for the embodiments fall within the scope of the appended claims.

It will be clearly understood by those skilled in the art that various changes and modifications to the aforementioned embodiments related to the array antenna operating at the mmWave band and the electronic device controlling the same are made without departing from the idea and scope of the present disclosure. Therefore, it should be understood that such various modifications and alternations for the embodiments fall within the scope of the appended claims.

So far, the antenna module disposed in the display to operate in the millimeter wave (mmwave) band and the electronic device controlling the same have been described. Hereinafter, technical effects of the antenna module disposed in the display operating in the millimeter wave (mmwave) band and the electronic device including the configuration for controlling the same will be described.

According to an embodiment, an antenna element operating in an mmWave band can be implemented in a metal mesh structure within a display, to communicate with another device in a front direction.

According to an embodiment, an antenna configuration capable of improving transparency of an antenna disposed in a display by using a dummy pattern while improving an electrical characteristic of the antenna can be provided.

According to an embodiment, an antenna module implementing dual polarization characteristics can be provided in a double-layered patch antenna.

According to an embodiment, an antenna module implemented in a display, which is capable of minimizing a spacing between antennas and minimizing a signal loss characteristic in an mmWave band through impedance matching in a transition region between a transparent antenna and a feed line, can be provided.

According to an embodiment, transparency can be maintained while maintaining antenna performance through alignment between metal mesh grids of a radiator and metal mesh grids of a ground pattern.

According to an embodiment, a second metal mesh pattern for a double-layered antenna structure can operate as a ground pattern, thereby suppressing interference between a touch sensor/circuit and a first metal mesh pattern on which an antenna pattern is formed.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the aforementioned disclosure, design and operations of an antenna operating in a mmWave band and an electronic device controlling the same can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller of the terminal. Therefore, it should also be understood that the above-described implementations are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. An antenna module comprising:
a flexible printed circuit board (FPCB) having first ground patterns formed at both sides of a feed line formed on one surface thereof, the first ground patterns being spaced apart from the feed line;
a first dielectric substrate configured such that a first metal mesh pattern is connected to the feed line formed on the one surface of the FPCB; and
a second metal mesh pattern configured such that a second metal mesh pattern is connected to a second ground pattern formed on another surface of the FPCB,
the first metal mesh pattern comprises:
an antenna pattern in which metal mesh grids are interconnected in one axial direction and another axial direction;
a feed pattern in which metal mesh grids are interconnected in the one axial direction; and
a dummy pattern in which metal mesh grids are disconnected in the one axial direction and the another axial direction.

2. The antenna module of claim 1, wherein an antenna element formed by a plurality of mesh grids formed by the first metal mesh pattern is disposed on top or bottom of a display or inside the display, and
the feed line formed with a predetermined width on the FPCB is connected to the feed pattern that feeds the antenna element.

3. The antenna module of claim 2, wherein the feed line comprises:
a transition region implemented as a CPW transmission line with the first ground patterns disposed at the both sides of the feed line and configured to perform impedance matching between the antenna element and the feed line; and
a signal line region in which the feed line is disposed by a predetermined length in a first axial direction, and
the feed line disposed in the signal line region is formed as a microstrip line on the FPCB.

4. The antenna module of claim 1, wherein the dummy pattern comprises a first dummy pattern disposed in a dielectric region and having metal mesh grids disposed to be disconnected from one another in the one axial direction and the another axial direction.

5. The antenna module of claim 1, wherein the ground pattern further comprises a second dummy pattern disposed between the antenna pattern and the feed pattern, and having metal mesh grids disposed in the another axial direction to be disconnected from the antenna pattern and the feed pattern.

6. The antenna module of claim 1, wherein the antenna pattern operates as a dual polarization antenna with polarization in the one axial direction and polarization in the another axial direction by the feed pattern and the second feed pattern, and
the second feed pattern is configured such that metal mesh grids are interconnected in the another axial direction.

7. The antenna module of claim 1, wherein the second metal mesh pattern is configured such that metal mesh grids are interconnected in the one axial direction and the another axial direction to form a ground pattern, and
the antenna pattern of the first metal mesh pattern and the ground pattern corresponding to the second metal mesh pattern configure a patch antenna that radiates a wireless signal toward top of the first dielectric substrate.

8. The antenna module of claim 1, wherein shape, thickness in a height direction, and line width of the first metal mesh pattern correspond to shape, thickness in a height direction, and line width of the second metal mesh pattern.

9. The antenna module of claim 8, wherein a first point where grids of the first metal mesh pattern intersect in the one axial direction and the another axial direction corresponds to a second point where grids of the second metal mesh pattern intersect in the one axial direction and the another axial direction.

10. The antenna module of claim 1, further comprising an OCA layer disposed on the same layer as the FPCB and configured to bond the first dielectric substrate and the second dielectric substrate.

11. The antenna module of claim 1, wherein the second dielectric substrate is disposed in an upper region of a display, and the antenna pattern radiates a wireless signal toward a top of the first dielectric substrate.

12. The antenna module of claim 1, wherein the first dielectric substrate is attached to a lower region of a display, and the second dielectric substrate is attached to an upper region of a lower structure, and
the antenna pattern radiates a wireless signal through the display on a top of the first dielectric substrate.

13. The antenna module of claim 1, wherein the antenna module is disposed between a first display and a second display,
the first dielectric substrate is attached to a lower region of the first display, and the second dielectric substrate is attached to an upper region of the second display, and
the antenna pattern radiates a wireless signal through the first display on a top of the first dielectric substrate.

14. The antenna module of claim 1, wherein the FPCB is pre-bonded to an ACF layer by a heat-based pressing operation, and bonded to the second dielectric substrate in a state where the second metal mesh pattern formed on the second dielectric substrate is aligned with the ground pattern on another surface of the FPCB, and
an OCA layer is formed in a region adjacent to the FPCB on the same layer as the FPCB to correspond to an upper end of the FPCB.

15. The antenna module of claim 14, wherein a second ACF layer is attached to a top of the feed line formed on one surface of the FPCB,
the FPCB is pre-bonded to the second ACF layer by a heat-based pressing operation,
the FPCB is bonded to the first dielectric substrate in a state where the first metal mesh pattern formed on the first dielectric substrate is aligned with the feed line on the one surface of the FPCB.

16. An electronic device having an antenna module, the electronic device comprising:

a display configured to output information to a screen and having a metal mesh pattern to radiate wireless signals to adjacent electronic devices; and an antenna module disposed on a lower region of the electronic device, the antenna module comprises:

a flexible printed circuit board (FPCB) with a feed line and a ground pattern formed on one surface and another surface thereof;

a first dielectric substrate configured such that a first metal mesh pattern is connected to the feed line formed on the FPCB; and a second dielectric substrate configured such that a second metal mesh pattern is connected to the ground pattern formed on the FPCB, the first metal mesh pattern comprises:

an antenna pattern configured such that metal mesh grids are interconnected in one axial direction;

a feed pattern configured such that metal mesh grids are interconnected in the one axial direction; and a dummy pattern configured such that metal mesh grids are disconnected in the one axial direction and the another axial direction.

17. The electronic device of claim 16, wherein the dummy pattern comprises:

a first dummy pattern disposed in a dielectric region and having metal mesh grids disposed to be disconnected from one another in the one axial direction and the another axial direction; and a second dummy pattern disposed between the antenna pattern and the feed pattern, and having metal mesh grids disposed in the another axial direction to be disconnected from the antenna pattern and the feed pattern.

18. The electronic device of claim 16, wherein the antenna pattern operates as a dual polarization antenna with polarization in the one axial direction and polarization in the another axial direction by the feed pattern and the second feed pattern, and the second feed pattern is configured such that metal mesh grids are interconnected in the another axial direction.

19. The electronic device of claim 18, further comprising:

a transceiver circuit electrically connected to the antenna module and configured to apply a first signal and a second signal to the antenna pattern through the feed pattern and the second feed pattern; and a processor operably coupled to the transceiver circuit to control the transceiver circuit, wherein the processor controls the transceiver circuit to perform first beamforming by a first signal and second beamforming by a second signal while performing multiple input/multiple output (MIMO), in response to the first signal and the second signal being applied to array antennas disposed in a plurality of antenna elements.

20. The electronic device of claim 16, wherein the second metal mesh pattern is configured such that metal mesh grids are interconnected in the one axial direction and the another axial direction, to form a ground pattern, and a wireless signal is radiated toward the front of the electronic device by the antenna pattern of the first metal mesh pattern and the ground pattern corresponding to the second metal mesh pattern.

* * * * *